(12) United States Patent
Balboni et al.

(10) Patent No.: US 11,973,057 B2
(45) Date of Patent: Apr. 30, 2024

(54) THROUGH-SILICON TRANSMISSION LINES AND OTHER STRUCTURES ENABLED BY SAME

(71) Applicant: Analog Devices, Inc., Wilmington, MA (US)

(72) Inventors: Ed Balboni, Littleton, MA (US); Ozan Gurbuz, Portland, OR (US); William B. Beckwith, Palmer Lake, CO (US); Paul Harlan Rekemeyer, Cambridge, MA (US)

(73) Assignee: Analog Devices, Inc., Wilmington, MA (US)

( * ) Notice: Subject to any disclaimer, the term of this patent is extended or adjusted under 35 U.S.C. 154(b) by 220 days.

(21) Appl. No.: 17/548,050

(22) Filed: Dec. 10, 2021

(65) Prior Publication Data

US 2022/0189917 A1     Jun. 16, 2022

Related U.S. Application Data

(60) Provisional application No. 63/125,450, filed on Dec. 15, 2020.

(51) Int. Cl.
*H01L 25/065*     (2023.01)
*H01L 23/00*      (2006.01)
*H01L 23/48*      (2006.01)

(52) U.S. Cl.
CPC ........ *H01L 25/0652* (2013.01); *H01L 23/481* (2013.01); *H01L 24/05* (2013.01);
(Continued)

(58) Field of Classification Search
CPC ......... H01L 23/481; H01L 2224/08146; H01L 2224/16146; H01L 2223/6616;
(Continued)

(56) References Cited

U.S. PATENT DOCUMENTS 7,317,256 B2    1/2008   Williams et al.
7,446,420 B1    11/2008  Kim
(Continued)

OTHER PUBLICATIONS

Ho et al., *High RF Performance TSV Silicon Carrier for High Frequency Application*, 2008 58th Electronic Components and Technology Conference, Jun. 24, 2008, 7 pages.

*Primary Examiner* — Mamadou L Diallo
(74) *Attorney, Agent, or Firm* — Knobbe, Martens, Olson & Bear, LLP

(57) ABSTRACT

One embodiment is a microelectronic assembly including an assembly support structure; a first die including a pair of hot via comprising through-substrate-via (TSVs) extending through the first die between first and second sides thereof and a plurality of ground vias surrounding the pair of hot vias and extending through the first die between the first and second sides thereof. The first die further includes a pair of signal interconnect structures electrically connected to the pair of hot vias disposed on the second side of the first die. The assembly further includes a second die between the assembly support structure and the first die the pair of signal interconnect structures disposed on the first side thereof. The first die is connected to the second die via a signal die-to-die (DTD) interconnect structure including the signal interconnect structures of the first and second dies.

20 Claims, 18 Drawing Sheets

(52) U.S. Cl.
CPC .............. *H01L 24/08* (2013.01); *H01L 24/16* (2013.01); *H01L 2224/05647* (2013.01); *H01L 2224/08146* (2013.01); *H01L 2224/13147* (2013.01); *H01L 2224/16146* (2013.01)

(58) Field of Classification Search
CPC ....... H01L 2225/06541; H01L 25/0652; H01L 2224/16145; H01L 2225/06565
See application file for complete search history.

(56) References Cited

U.S. PATENT DOCUMENTS

| | | | |
|---|---|---|---|
| 8,110,930 B2 | 2/2012 | Periaman et al. | |
| 8,227,708 B2 | 7/2012 | Li et al. | |
| 8,242,604 B2 | 8/2012 | Volant et al. | |
| 8,264,067 B2 | 9/2012 | Law et al. | |
| 8,294,240 B2 | 10/2012 | Nowak et al. | |
| 8,362,482 B2 | 1/2013 | Or-Bach et al. | |
| 8,362,599 B2 | 1/2013 | Kim et al. | |
| 8,525,343 B2 | 9/2013 | Yu et al. | |
| 8,541,884 B2 | 9/2013 | Conn et al. | |
| 8,759,950 B2 | 6/2014 | Kamgaing et al. | |
| 8,912,844 B2 | 12/2014 | Li et al. | |
| 9,000,577 B2 | 4/2015 | Droege et al. | |
| 9,184,130 B2 | 11/2015 | Henderson et al. | |
| 9,252,077 B2 | 2/2016 | Mozler et al. | |
| 9,659,668 B2 | 5/2017 | Veches | |
| 9,852,969 B2 | 12/2017 | Uzoh et al. | |
| 9,941,224 B2 | 4/2018 | Lamar et al. | |
| 10,026,666 B2 | 7/2018 | Juneja et al. | |
| 10,389,008 B2 | 8/2019 | Socher et al. | |
| 10,497,677 B1 | 12/2019 | Karp | |
| 10,541,185 B2 | 1/2020 | Kuo | |
| 10,818,608 B2 | 10/2020 | Liu et al. | |
| 10,950,547 B2 | 3/2021 | Mohammed et al. | |
| 10,956,644 B2 | 3/2021 | Barowski et al. | |
| 11,289,440 B1* | 3/2022 | Kirby | H01L 24/20 |
| 11,756,844 B2* | 9/2023 | Zhou | H01L 25/0657 257/737 |
| 2011/0037532 A1* | 2/2011 | Lascari | H05K 1/0222 333/27 |
| 2017/0125351 A1* | 5/2017 | Kulkarni | H01L 23/5389 |
| 2018/0038894 A1* | 2/2018 | Wang | G01R 1/07378 |
| 2018/0108965 A1* | 4/2018 | Huang | H01P 3/006 |
| 2020/0168567 A1* | 5/2020 | Lin | H01P 5/028 |
| 2020/0176416 A1* | 6/2020 | Ketterson | H01L 21/565 |
| 2021/0082846 A1* | 3/2021 | Lin | H01L 23/528 |
| 2022/0139874 A1* | 5/2022 | Lee | H01L 25/50 257/774 |
| 2022/0139880 A1* | 5/2022 | Lee | H01L 24/19 257/621 |
| 2022/0336431 A1* | 10/2022 | Yu | H01L 24/29 |
| 2023/0008292 A1* | 1/2023 | Richards | H01L 22/12 |
| 2023/0094594 A1* | 3/2023 | Molzer | H01L 23/49822 327/530 |

\* cited by examiner

THROUGH-SILICON TRANSMISSION LINES AND OTHER STRUCTURES ENABLED BY SAME

CROSS-REFERENCE TO RELATED APPLICATION

This patent application claims the benefit of the filing date of U.S. Provisional Patent Application Ser. No. 63/125,450, filed on Dec. 15, 2020, and entitled "THROUGH-SILICON TRANSMISSION LINES AND OTHER STRUCTURES ENABLED BY SAME," the content of which is hereby expressly incorporated by reference.

FIELD OF THE DISCLOSURE

This disclosure relates generally to the field of integrated circuit ("IC") devices and, more particularly, to through-substrate transmission lines and other structures enabled by such through-substrate transmission lines for use in connection with IC devices.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION

Overview

Figure 1:
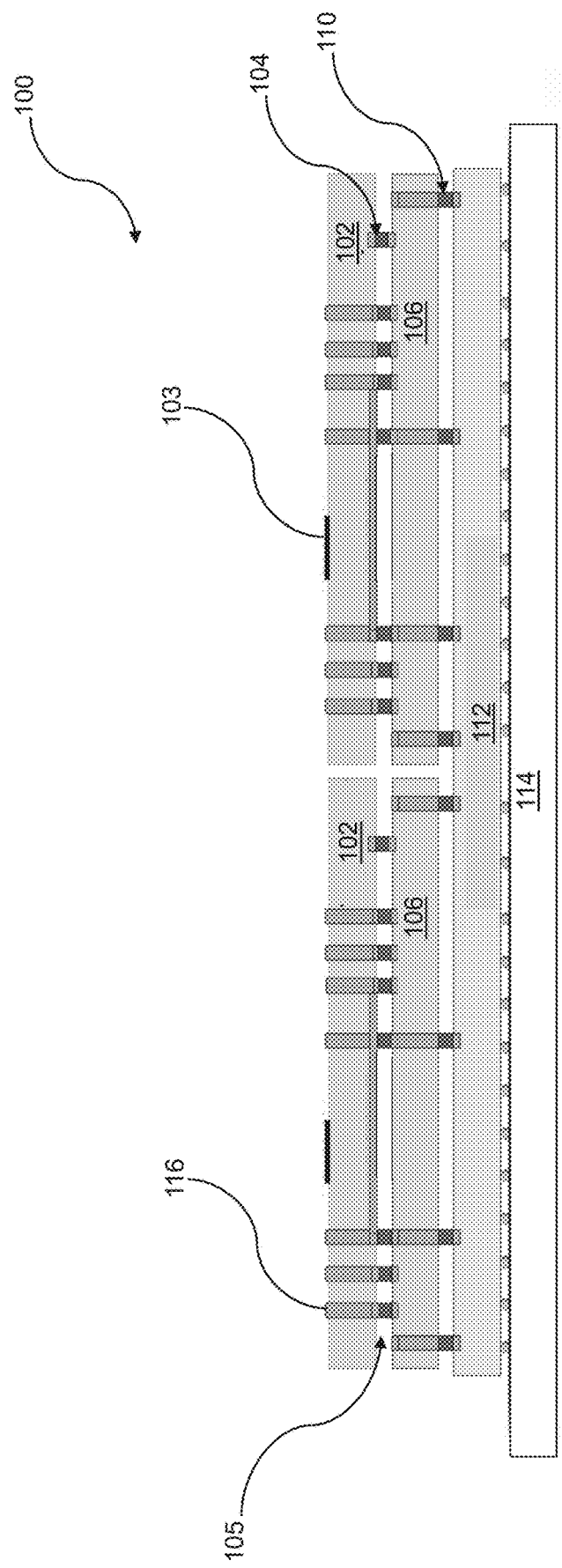
FIG. 1 is a schematic cross-sectional view of a microelectronic assembly according to some embodiments of the present disclosure.

The systems, methods, and devices of this disclosure each have several innovative aspects, no single one of which is solely responsible for all desirable attributes disclosed herein. Details of one or more implementations of the subject matter described in this specification are set forth in the description below and the accompanying drawings.

As used herein, the term "insulating material" refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, intrinsic silicon and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package substrates and other such components.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices. The term "circuit" means one or more passive and/or active components that are arranged to cooperate with one another to provide a desired function. The terms "substantially," "close," "approximately," "near," and "about," generally refer to being within +/−20% of a target value (e.g., within +/−5 or 10% of a target value) based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

Unless described otherwise, dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In other example, the term "interconnect" may be used to describe any element formed of an electrically conductive material for providing electrical connectivity to one or more components associated with an IC or/and between various such components. In context of an IC die/chip, the term "interconnect" may refer to both conductive lines/wires (also sometimes referred to as "lines" or "metal lines" or "trenches") and conductive vias (also sometimes referred to as "vias" or "metal vias"). In general, a term "conductive line" may be used to describe an electrically conductive element isolated by a dielectric material typically comprising an interlayer low-k dielectric that is provided within the plane of the IC die/chip. Such conductive lines are typically arranged in several levels, or several layers, of metallization stacks. On the other hand, the term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in not adjacent levels. A term "metallization stack" may be used to refer to a stack of one or more interconnects for providing connectivity to different circuit components of an IC die/chip. Sometimes, metal lines and vias may be referred to as "conductive lines/traces" and "conductive vias", respectively, to highlight the fact that these elements include electrically conductive materials such as, but not limited to, metals. On the other hand, in context of a stack of dies coupled to one another or in context of a die coupled to a package substrate, the term "interconnect" may refer to, respectively, to die-to-die (DTD) interconnects and die-to-package substrate (DTPS) interconnects.

In various embodiments, elements associated with an IC may include, for example, transistors, diodes, power sources, resistors, capacitors, inductors, sensors, transceivers, receivers, antennas, etc. In various embodiments, components associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed as part of a chipset for executing one or more related functions in a computer.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers. In addition, the term "dispose" as used herein refers to position, location, placement, and/or arrangement rather than to any particular method of formation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. When used herein, the notation "A/B/C" means (A), (B), and/or (C). Although certain elements may be referred to in the singular herein, such elements may include multiple sub-elements. For example, "an electrically conductive material" may include one or more electrically conductive materials. In another example, "a dielectric material" may include one or more dielectric materials.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

In the drawings, a particular number and arrangement of structures and components are presented for illustrative purposes and any desired number or arrangement of such structures and components may be present in various embodiments. Further, the structures shown in the figures may take any suitable form or shape according to material properties, fabrication processes, and operating conditions. For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 110a-110e), such a collection may be referred to herein without the letters (e.g., as "110").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Example Embodiments

Through-substrate transmission lines coupled with DTD stacking using bumping to enable high frequency DTD interconnects are disclosed. Radio frequency (RF) signal transmission structures may include both coaxial (coax) lines and twin transmission lines and may include of one or two hot through silicon vias (TSVs) for signal transmission surrounded by ground vias provided as shielding. Embodiments described herein provide a means of efficiently routing radio frequency (RF) signals between a first die, which may be referred to herein as a top die, and a second die, which may be referred to herein as a bottom die, over which the first die is stacked and are particularly useful in high-frequency array applications, in which the available die surface area is limited.

One embodiment may include twin transmission lines, in which two hot through silicon vias (TSVs) formed through a top die are closely coupled to form a controlled impedance transmission line. The two hot TSVs may be surrounded by ground vias to contain radio frequency (RF) signals within a substrate. As will be recognized by one of ordinary skill in the art, a hot via is a via that is not connected to ground. A hot via may be used for signal propagation, supply voltages, control lines. In contrast, a ground via is a via that is connected to ground.

The twin transmission lines may occupy approximately 40% of the area necessary to implement a coax line, making it more compact than a corresponding coax line. Additionally, a differential configuration as enabled by a twin transmission line arrangement can provide better common mode rejection and hence better rejection of common mode interference.

In a particular embodiment, the twin transmission lines may then be routed a short distance to a copper pillar bump (or DTD interconnect structure) provided on a back side of the top die. A second copper pillar bump (or DTD interconnect structure) which may be larger than the first DTD interconnect structure provided on the back side of the top die may be provided on a front side of the bottom die. The top and bottom dies are stacked such that the respective DTD interconnects thereof may be connected by reflowing solder caps provided on each of the interconnect structures together to form a mechanical and an electrical connection between the top and bottom dies.

The short routing from the TSVs to the DTD interconnect structures on the back side of the top die, as well as the low dielectric constant between the top and bottom dies, may result in the stacked structure being somewhat inductive in certain embodiments. In one example embodiment, 1 −dB bandwidth was limited to 90 GHz. In this particular example, the addition of a small series capacitor on a front side of the bottom die may cause the response to be bandpass centered at approximately, 120 GHz with a loss of 0.4 dB and a 1 −dB bandwidth of 50 GHz. Such filtering can be useful in arrays by providing out-of-band rejection.

In alternative embodiments, the DTD interconnects may be implemented with the copper pillar (or bump) of the top die or the bottom die, replaced by a solderable pad for bonding with a DTD interconnect element of the other die (e.g., a copper pillar or bump). The DTD interconnects in still other embodiments may be achieved in a solderless fashion using hybrid bonding, wherein the DTD interconnection is formed by connection of exposed metal traces embedded in an insulator on both top and bottom die. Additionally, in alternative embodiments, the hot TSV may be coaxial with the corresponding DTD interconnect, in which case the signal need not be routed laterally (e.g., through a redistribution layer (RDL) of the first die) to the DTD interconnect, as described above. Instead, the routing between the hot TSV and the corresponding DTD interconnect is through a passivation via.

In accordance with embodiments described herein, the back side of the top die is metalized with the ability to pattern the metal with line widths and spacings of 15 μm or less. This allows for the inclusion of backside transmission lines, which can be used for voltage controlled oscillator (VCO) transmission line resonators, as well as for other magnetic circuits such as inductors, baluns, couplers, and transformers.

FIG. 1 is a schematic cross-sectional illustration of a microelectronic assembly 100, according to some embodiments of the present disclosure. Microelectronic assembly 100 may comprise a semiconductor package. As shown in FIG. 1, assembly 100 may include one or more integrated circuit (IC) dies, represented in FIG. 1 by dies 102, each of which may include electrical devices including but not limited to cavity-backed antennas 103. Dies 102 may comprise a semiconductor material including, for example, N-type or P-type materials. Dies 102 may include, for example, a crystalline substrate formed using a bulk silicon (or other bulk semiconductor material) or a semiconductor-on-insulator (SOI, e.g., a silicon-on-insulator) structure. In some embodiments, dies 102 may be formed using alternative materials, which may or may not be combined with silicon, that include, but are not limited to, lithium niobite, indium phosphide, silicon dioxide, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. In some embodiments, dies 102 may comprise a non-crystalline material, such as polymers. In some embodiments, dies 102 may be inhomogeneous, including a carrier material (such as glass or silicon carbide) as a substrate with a thin semiconductor layer over which is an active side of the die 102. Although a few examples of the material for dies 102 are described here, any material or structure that may serve as a foundation upon which IC circuits and structures as described herein may be built falls within the spirit and scope of the present disclosure as dies 102.

In the illustrated embodiment, dies 102 may be electrically coupled by way of interconnects 104, 105, to dies 106. In order to readily distinguish dies 102 from dies 106, dies 102 may be referred to herein as "top dies" or alternatively as "second-level dies," while dies 106 may be referred to herein as "bottom dies" or alternatively as "first-level dies." Interconnects 104 may comprise die-to-die (DTD) interconnects along with associated conductive traces, planes, vias, RDLs, and pads enabling electrical coupling between top dies 102 and bottom dies 106. Note that some component parts of interconnects are shown in FIG. 1 but are not labeled separately so as to not clutter the drawing.

In some embodiments, bottom dies 106 may comprise an IC configured to electrically integrate with top dies 102 to achieve an intended functionality of assembly 100. In some embodiments, dies 106 may comprise active components, including one or more transistors, voltage converters, transimpedance amplifiers (TIA), clock and data recovery (CDR) components, microcontrollers, etc. In some embodiments, dies 106 may comprise passive circuitry sufficient to enable interconnection to top dies 102 and other components in assembly 100 without any active components. In some embodiments, dies 106 may extend under a substantial area of top dies 102; in other embodiments, dies 106 may overlap with top dies 102 along one or more edges. In various embodiments, dies 106 and top dies 102 may overlap sufficiently to enable disposing interconnects 104, 105, with a desired pitch and number of interconnections that enable assembly 100 to function appropriately.

Interconnects 110 comprising die-to-package-substrate (DTPS) interconnects, and associated conductive traces, planes, vias, RDLs, and pads may provide electrical coupling between dies 106 and a package support 112, which in some embodiments may be implemented as an organic laminate interposer. In various embodiments, package support 112 may comprise a single or multi-layered insulating material with metallization including planes, traces, vias, and passive components (e.g., inductors, capacitors) within the insulating material and/or on the surfaces. Package support 112 may comprise ceramic (e.g., alumina) and/or organic material (e.g., epoxy based FR4, resin based bismaleimide triazine (BT), or polyimide). Package support 112 may provide mechanical base support and appropriate interfaces to access components in assembly 100 electrically. As shown in FIG. 1, package support 112 may be connected to a multilayer printed circuit board 114, which may provide power as well as application specific control signals and connectors.

Interconnects 110 may comprise any suitable interconnection, with corresponding metallization, pads and vias. Note that the shapes of various interconnects shown in the figure are merely for illustrative purposes and are not to be construed as limitations. The shapes of interconnects 104, 105, and/or 110, for example, may result from natural processes occurring during solder reflow. The shapes may depend on material viscosity in liquid state, temperatures of processing, surface tension forces, capillary action, and other mechanisms beyond the scope of the present disclosure. Additionally, interconnects 110 may be implemented as wirebond rather than bumps or pillars.

It will be recognized that one more levels of underfill and/or solder resist (e.g., organic polymer material such as benzotriazole, imidazole, polyimide, or epoxy) may be provided in assembly 100 and are not labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

Although not specifically shown in all of the present illustrations in order to not clutter the drawings, when DTD or DTPS interconnects are described, a surface of a first IC (or die) may include a first set of conductive contacts, and a surface of a second IC (or die) or a package support may include a second set of conductive contacts. One or more conductive contacts of the first set may then be electrically and mechanically coupled to some of the conductive contacts of the second set by the DTD or DTPS interconnects. In some embodiments, the pitch of the DTD interconnects may be different from the pitch of the DTPS interconnects, although, in other embodiments, these pitches may be substantially the same.

The DTD and DTPS interconnects disclosed herein may take any suitable form. In some embodiments, DTD and DTPS interconnects may include solder (e.g., solder bumps or balls that are subject to a thermal reflow to form the interconnects). DTD and DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In alternative embodiments, DTPS interconnects may be implemented using wirebond.

In some embodiments, the ICs on either side of a set of DTD interconnects may be unpackaged dies, and/or the DTD interconnects may include small conductive bumps or pillars (e.g., copper bumps or pillars) attached to the respective conductive contacts by solder. In some embodiments, the DTD interconnects may be used as data transfer lanes, while the DTPS interconnects may be used for power and ground lines, among others.

In various embodiments, more or fewer elements than described above may be included in assembly 100, compared to what is shown in FIG. 1. In some embodiments, conductive metallization lines may extend into and out of the plane of the drawing, providing conductive pathways to route electrical to and/or from various elements in assembly 100. The conductive vias and/or lines that provide conductive pathways in/on the assembly 100 may be formed using any suitable fabrication techniques.

Note that in the figure, interconnects 104, 105, 110, may be shown aligned with vias merely for illustrative purposes. In various embodiments, appropriate conductive traces may allow for some interconnect structures to be located away from vias and vice versa. In a general sense, interconnect structures may be arranged within assembly 100 to route electrical signals according to a wide variety of designs. During operation of assembly 100, electrical signals may be routed to and/or from dies 102 through the conductive contacts and conductive pathways of assembly 100.

It will be recognized that although some components of the assembly 100 are illustrated in FIG. 1 as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In various embodiments, any of the features discussed with reference to FIG. 1 herein may be combined with any other features to form a package as described herein, for example, to form a modified assembly 100. Some such combinations are described above, but, in various embodiments, further combinations and modifications are possible.

In accordance with features of embodiments described herein and as will be described in greater detail hereinbelow, interconnects 105 include TSVs 116 that, as shown in FIG. 1, are arranged in pairs. TSVs 116 comprise "hot" vias for implementing twin high performance RF signal transmission lines.

Figure 2:
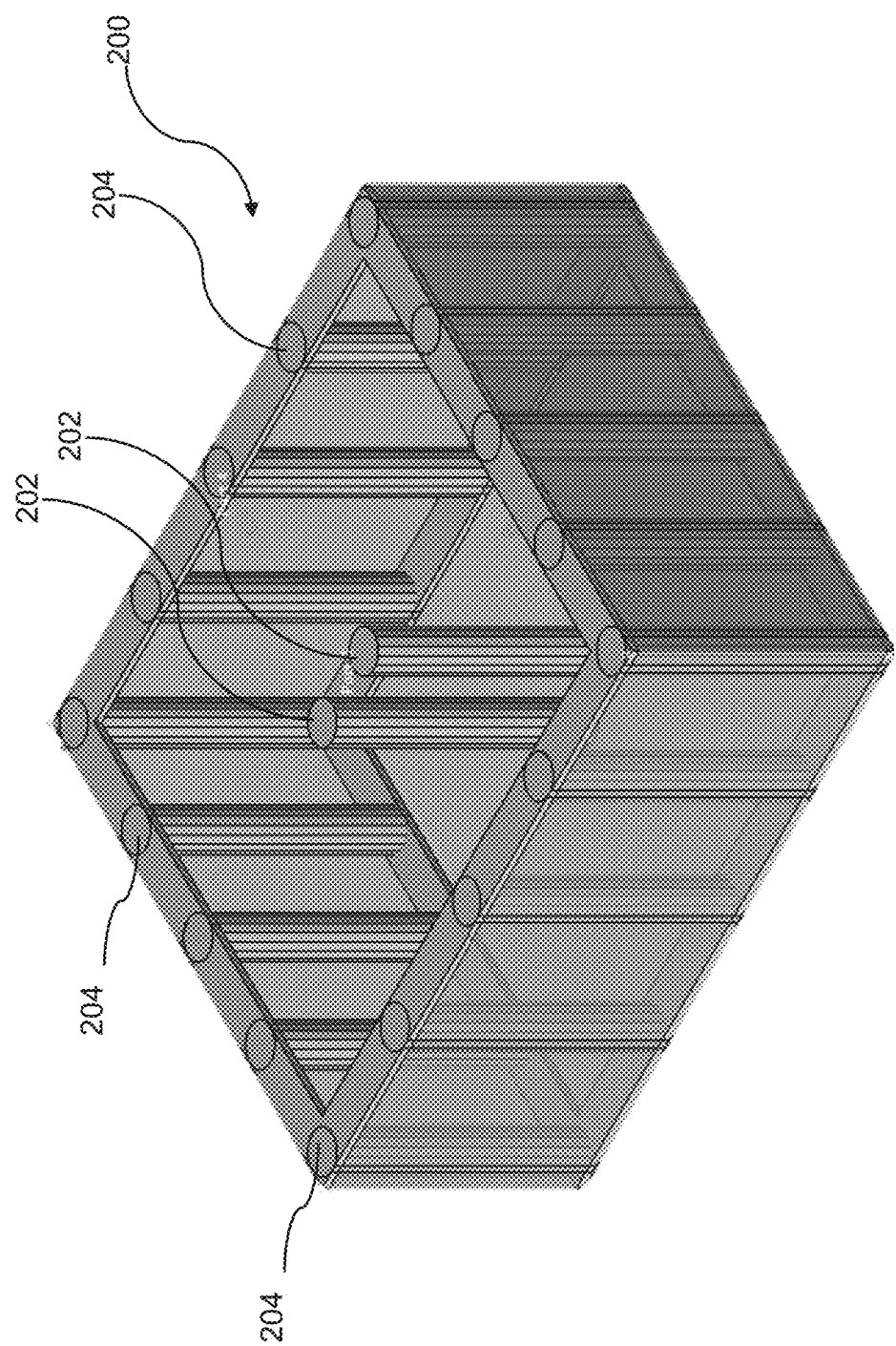
FIG. 2 illustrates an RF signal transmission line arrangement for a microelectronic assembly implemented using a pair of hot TSVs according to some embodiments of the present disclosure.

FIG. 2 illustrates an RF signal transmission line arrangement 200 for a microelectronic assembly, such as assembly 100, implemented using a pair of hot TSVs 202 (similar to hot TSVs 116) according to some embodiments of the present disclosure. As shown in FIG. 2, hot TSVs 202 are surrounded by ground vias, which may be TSVs, 204. Although ground vias 204 are shown as being arranged in a rectangular shape around the pair of hot TSVs 202, it will be recognized that ground vias 204 may be arranged around the pair of hot TSVs 202 in other configurations without departing from the spirit or scope of embodiments described herein.

It will be recognized that the range of diameters for the hot TSVs 202 may be influenced and/or dictated by processing capabilities of fabricators, an acceptable and/or reasonable aspect ratio of TSV length-to-diameter, wafer thickness, which may be process and/or application-dependent, and available die surface area. In certain embodiments, acceptable diameters for hot TSVs, such as hot TSVs 202, may range from approximately 10 µm to 100 µm. A distance between the hot TSVs may be approximately equal to one to two times the diameter of the hot TSVs in a silicon implementation.

Similarly, the range of diameters for the ground vias 204 may be influenced and/or dictated by processing capabilities of fabricators, an acceptable and/or reasonable aspect ratio of TSV length-to-diameter, wafer thickness, which may be process and/or application-dependent, and available die surface area. In certain embodiments, acceptable diameters for ground vias, such as ground vias 204, may range from approximately 10 µm to 100 µm. A distance between the ground vias may be approximately equal to one to two times the diameter of the ground vias in a silicon implementation. In general, a distance between the ground vias needs to be small relative to a wavelength at the circuit frequency of operation.

Ground vias 204 may be arranged around hot TSVs 202 at a distance sufficient to prevent impact on the impedance of the twin line. For a coax arrangement, such as shown and described below with reference to FIG. 11, the distance of the ground vias from the hot TSV is a function of the diameter of the hot via and the desired impedance.

Figure 3:
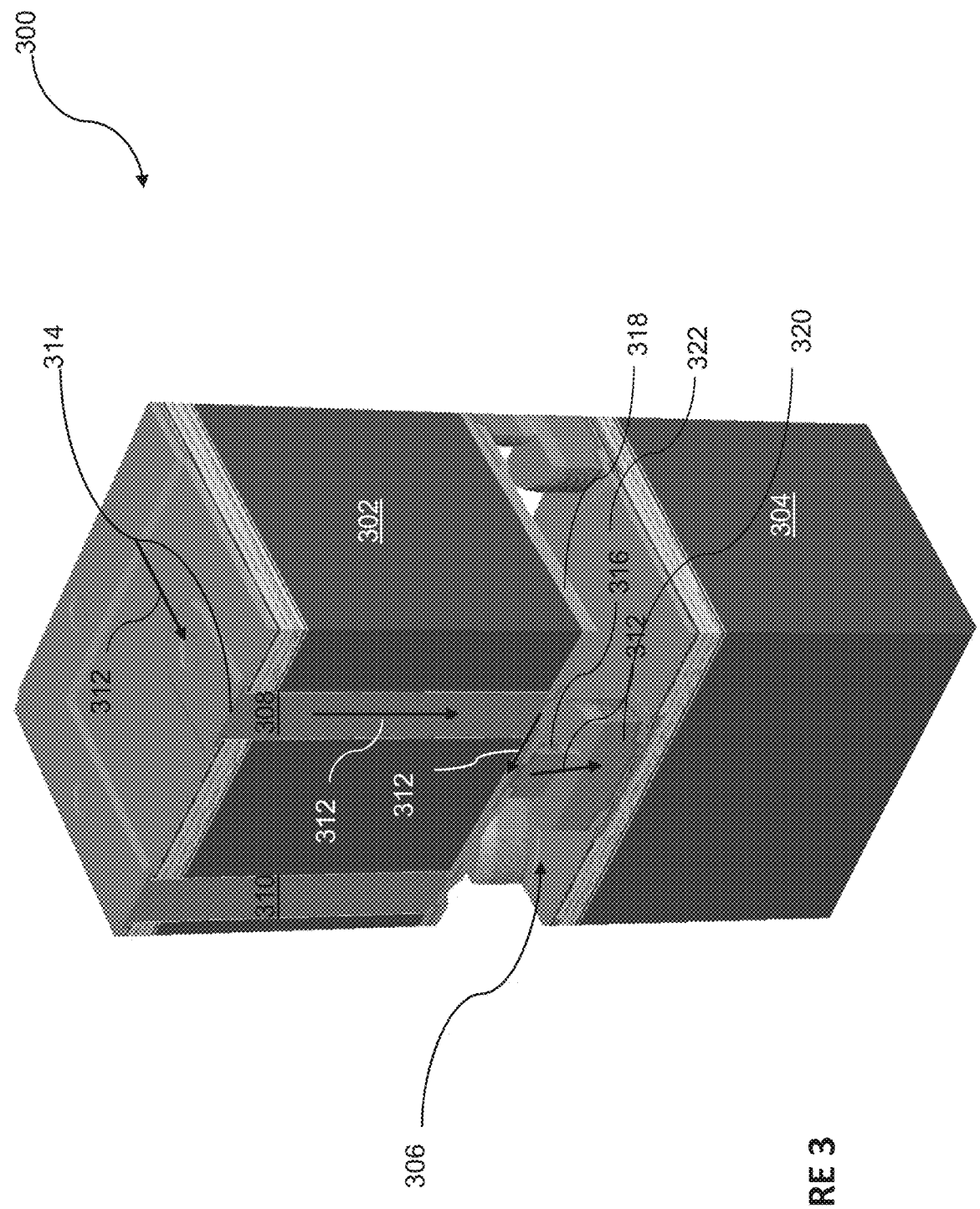
FIG. 3 illustrates a side cutaway perspective view of a portion of a microelectronic assembly including a top die connected to a bottom die and showing a hot TSV through the top die according to some embodiments of the present disclosure.

FIG. 3 illustrates a side cutaway perspective view of a portion of a microelectronic assembly 300 including a top die 302 connected to a bottom die 304 via an interconnect structure 306 connected to a hot TSV 308. Hot TSV 308 comprises one of a pair of hot TSVs surrounded by ground vias, such as ground via 310. In the particular embodiment illustrated in FIG. 3, arrows 312 designate an RF signal path through the TSV 308 to the bottom die 304; however, it will be recognized that in other embodiments, the RF signal path may be different and may include fewer than all of the arrows 312. A reference numeral 314 designates a TSV feed-in with front side post-passivation interconnect.

In one embodiment, as shown in FIG. 3, interconnect structure 306 includes a copper pillar (or bump) 316 on the back side 318 of the top die 302 and a copper pillar (or bump) 320 on a front side 322 of the bottom die 304. It will be recognized that the pillars/bumps could be replaced by a relatively flat solderable pad. Pillars 316, 320, are interconnected by solder bumps or balls disposed on one or both of the pillars that have been subjected to a thermal reflow to interconnect the pillars. In one embodiment, as shown in FIG. 3 and as will be described in greater detail hereinbelow, at its widest point, the pillar 320 may have a larger diameter and distal surface area than the pillar 316 to facilitate manufacturability of the assembly 300. In alternative embodiments, at its widest point, the pillar 320 may have substantially the same diameter and distal surface area as the pillar 316.

Figure 4:
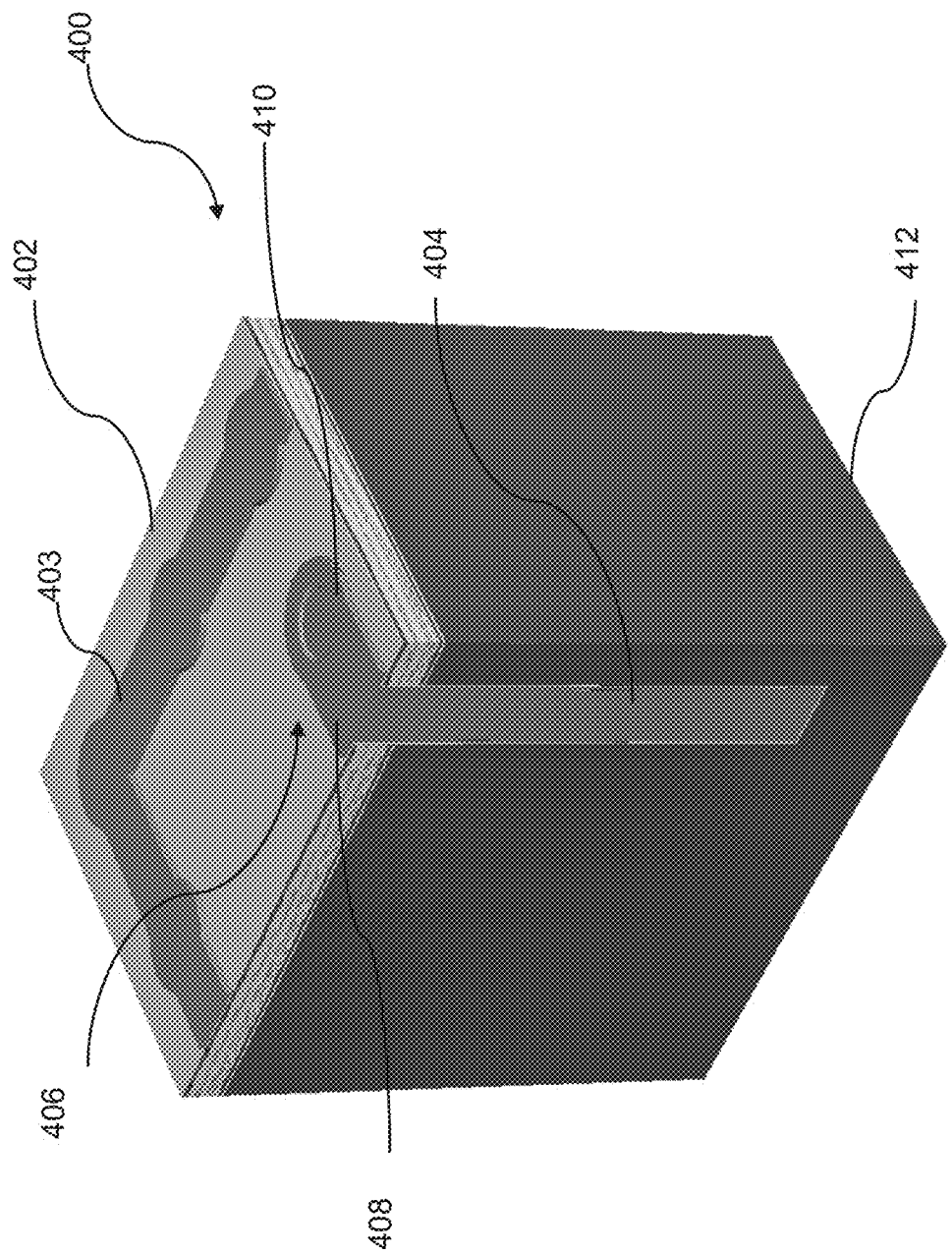
FIG. 4 illustrates a side cutaway perspective view of a front side of a top die of a microelectronic assembly according to some embodiments of the present disclosure.

FIG. 4 illustrates a side cutaway perspective view of a top die 400 for use in a microelectronic assembly, such as the microelectronic assembly 100 (FIG. 1). As shown in FIG. 4, in one embodiment, a front side 402 of the top die 400 includes a ground plane 403 over ground vias (not shown in FIG. 4) surrounding a hot TSV 404, which comprises one of a pair of hot TSVs. In the illustrated embodiment, TSV contact 406 includes a flush contact area 408 provided directly over the TSV 404 and a recessed contact area 410 provided to foundry top metal. In the embodiment illustrated in FIG. 4, a back side 412 of the die 400 has not yet been thinned to expose the TSV 404 through the back side.

Figure 5:
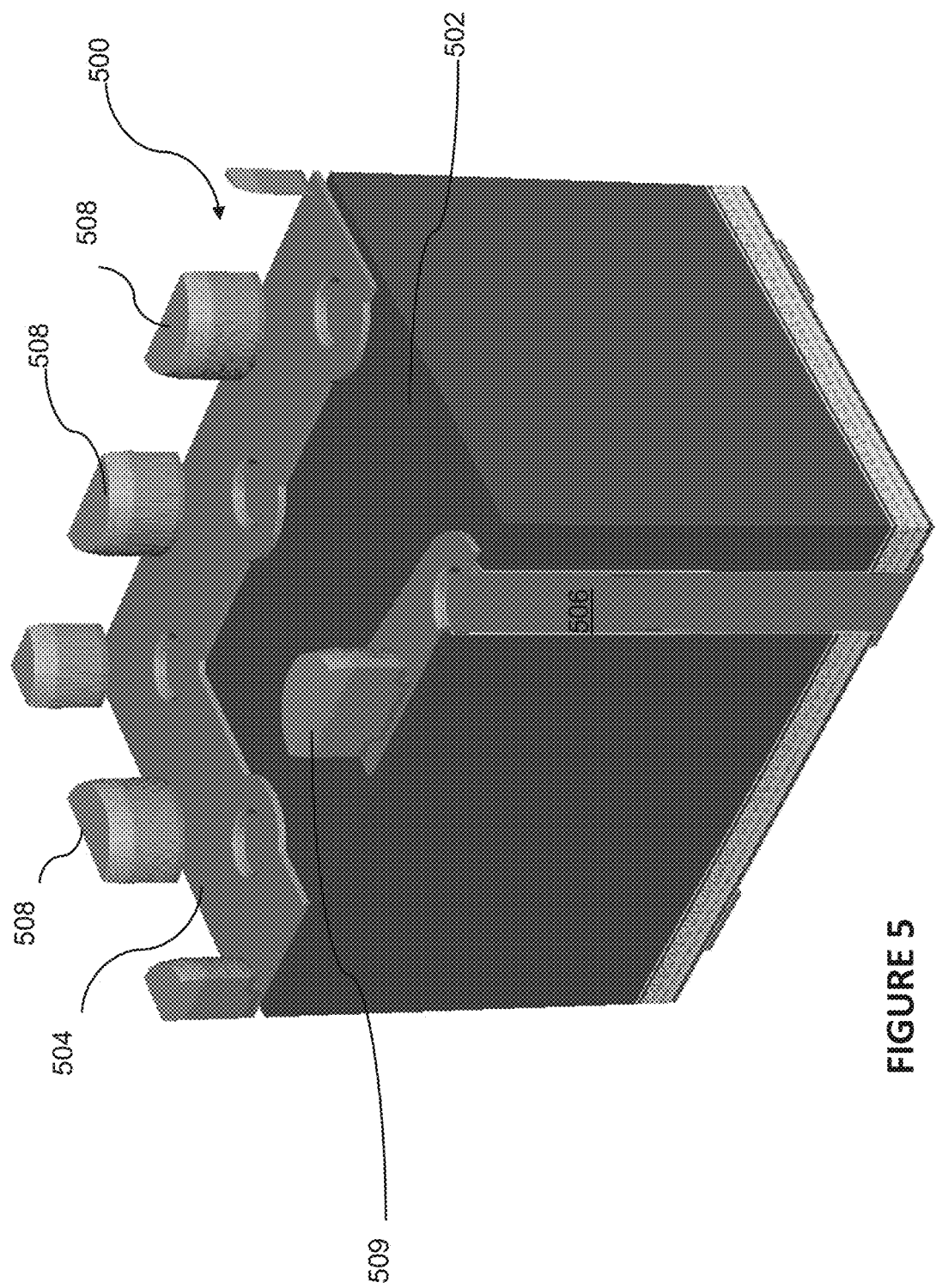
FIG. 5 illustrates a side cutaway perspective view of a back side of a top die of a microelectronic assembly according to some embodiments of the present disclosure.

FIG. 5 illustrates a perspective cutaway view of a top die 500 for use in a microelectronic assembly, such as the microelectronic assembly 100 (FIG. 1). As shown in FIG. 5, a back side 502 of the die 500 includes a copper RDL and/or ground plane 504, which covers a majority of the back side 502 other than hot TSV transitions, which may include the TSV 506, RDL, DTD interconnect, and the open region in the ground plane between the hot and ground TSVs. Copper pillars comprising ground bumps 508 and a signal bump 509 including solder on distal surfaces thereof are provided for forming DTD interconnects with corresponding copper pillars on a front side of a bottom die (not shown in FIG. 5). It will be recognized that DTD interconnects shown and described herein may be implemented using a solderable pad as opposed to a bump or pillar.

Figure 6:
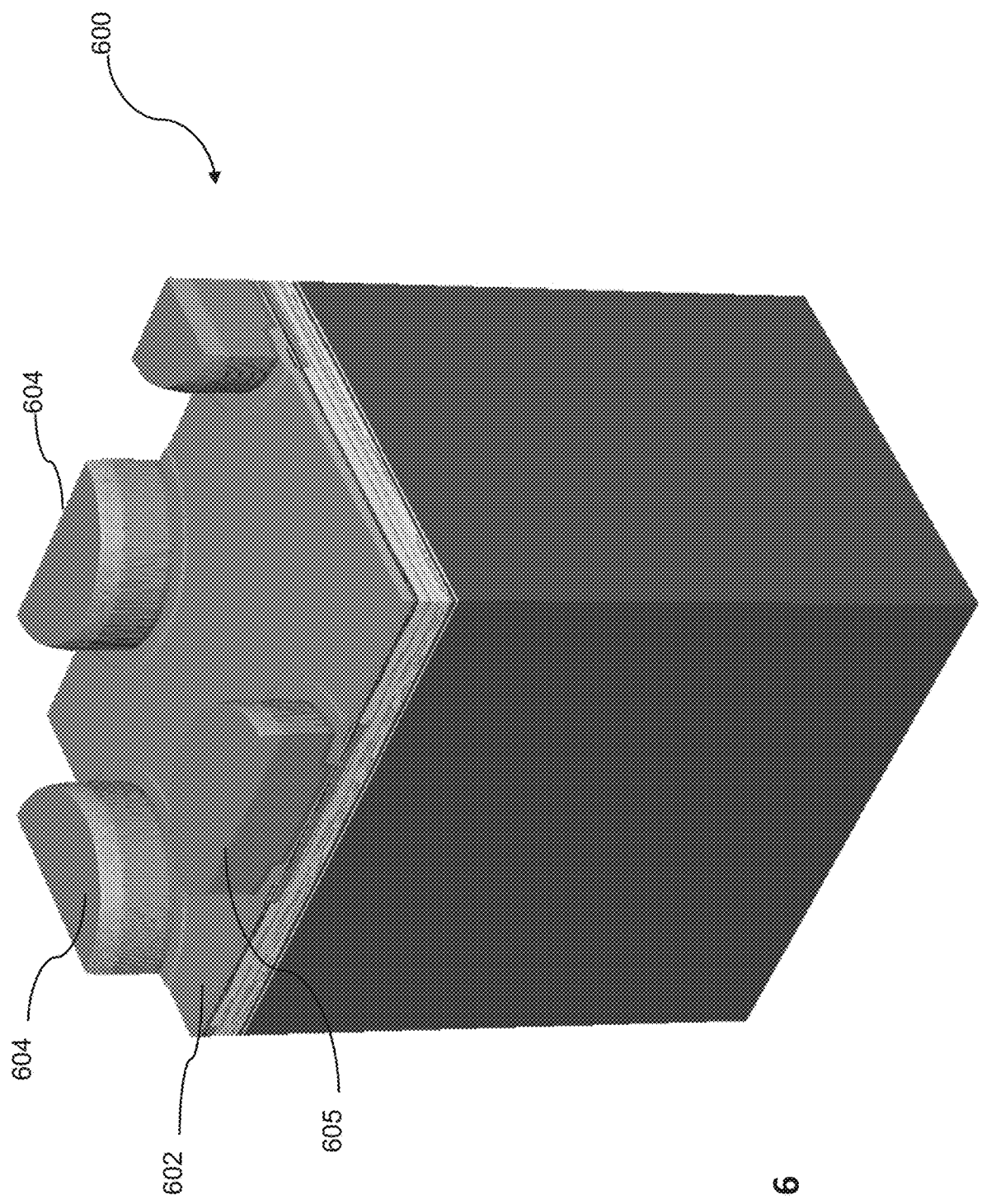
FIG. 6 illustrates a perspective view of a front side of a bottom die of a microelectronic assembly according to some embodiments of the present disclosure.

FIG. 6 illustrates a perspective cutaway view of a bottom die 600 for use in a microelectronic assembly, such as the microelectronic assembly 100 (FIG. 1). As shown in FIG. 6, in one embodiment, a front side 602 of the die 600 includes a number of copper pillars including ground bumps 604 and a signal bump 605, including solder on distal surfaces thereof for forming DTD interconnections with corresponding copper pillars of a top die (not shown in FIG. 6). In accordance with features of particular embodiments, each of the copper pillars 604 has a diameter at its widest point of approximately 75 μm. In other embodiments, the maximum diameter of copper pillars 604 may range from 25 μm to 100 μm.

Figure 7:
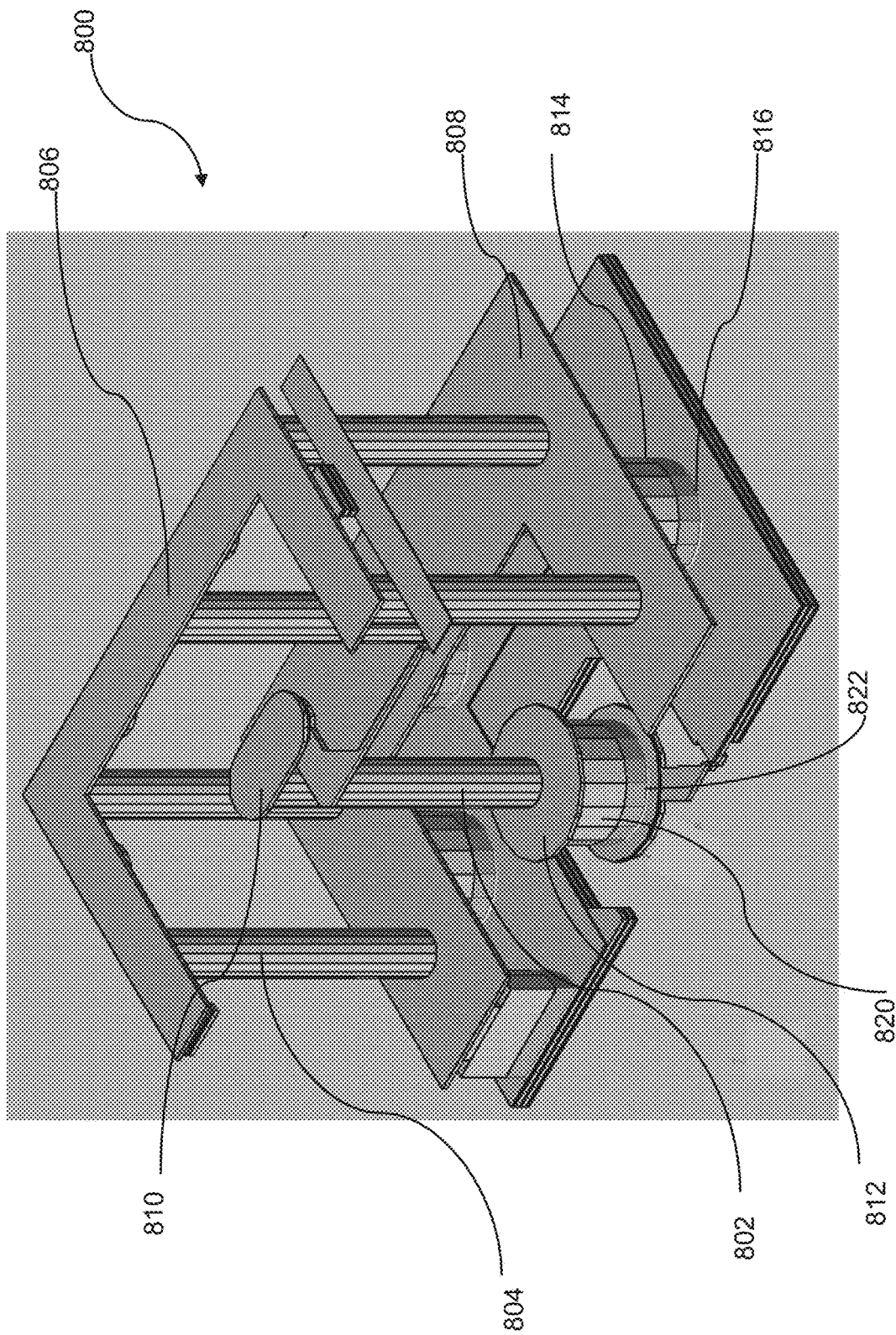
FIG. 7 illustrates a three-dimensional model of select metal components of a portion of a microelectronic assembly according to some embodiment of the present disclosure.

FIG. 7 illustrates a three-dimensional model of select components of half of an RF signal transmission line arrangement 800 (similar to the arrangement 200 (FIG. 2)) for use in a microelectronic assembly, such as microelectronic assembly 100 (FIG. 1), according to some embodiments of the present disclosure. As shown in FIG. 7, arrangement 800 includes a hot TSV 802, which includes one of a pair of hot TSVs, surrounded by ground vias 804. A ground plane 806 electrically connected to ground vias 804 is provided on a front side of a top die (not shown in FIG. 7). Similarly, a ground plane 808 electrically connected to ground vias 804 is provided on a back side of the top die (not shown in FIG. 7). A hot TSV transition 810 electrically connected to the hot TSV 802 is also provided on the front side of the top die (not shown in FIG. 7). Similarly, a hot TSV transition 812 electrically connected to the hot TSV 802 is also provided on the back side of the top die (not shown in FIG. 7). Copper pillars (e.g., ground pillars) 814 are electrically connected to the ground plane 808 for forming DTD connections with corresponding solderable pads 816 (e.g., ground pads) provided on a front side of a bottom die (not shown in FIG. 7). Similarly, a copper pillar (e.g., a signal bump) 820 is electrically connected to the hot TSV transition 812 for forming a DTD connection with a corresponding solderable pad (e.g., signal pad) 822 provided on the front side of the bottom die (not shown in FIG. 7).

Figure 8A:
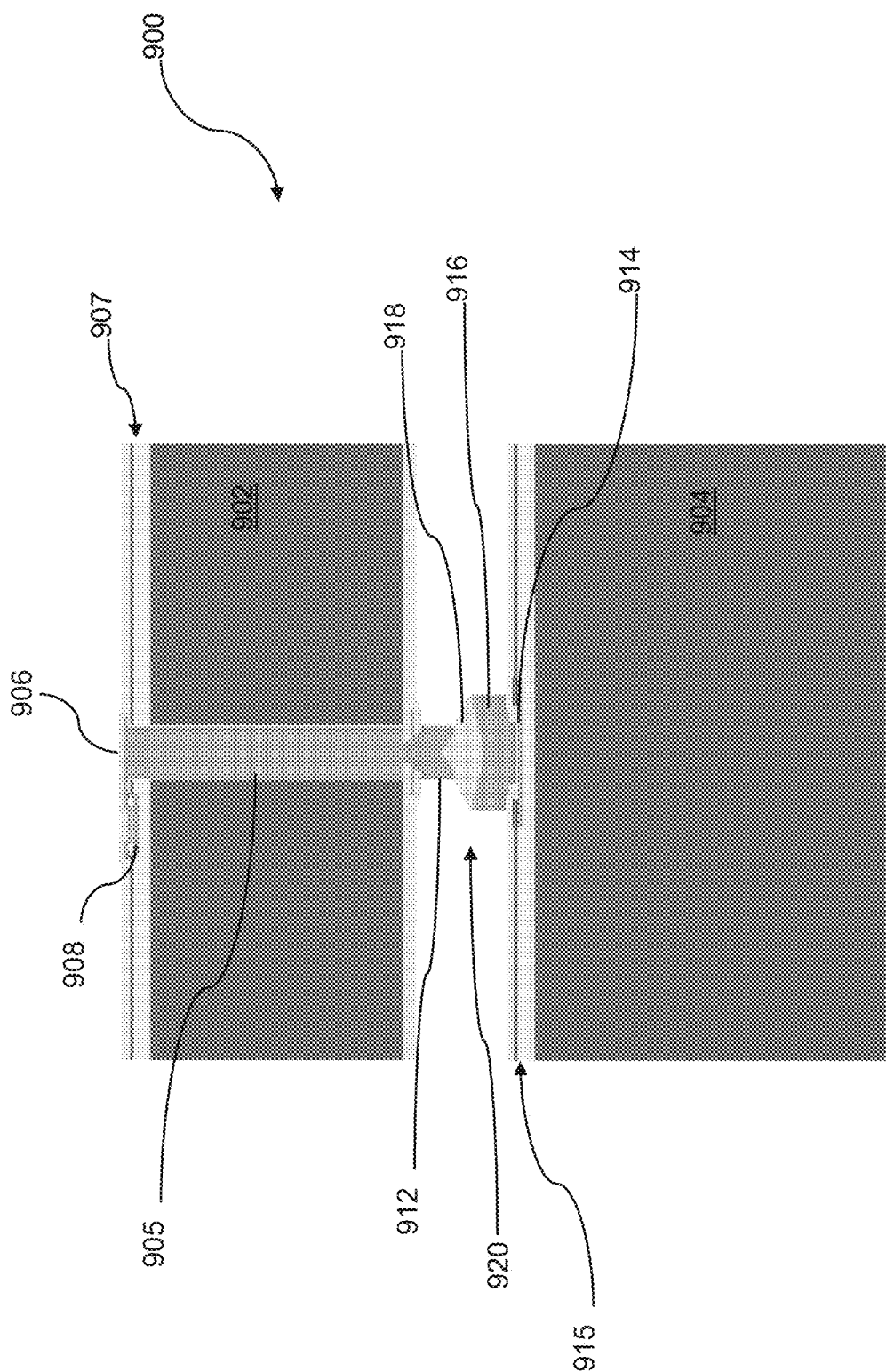
FIG. 8A is a schematic view of an interconnection between a top die and a bottom die of a microelectronic assembly according to some embodiments of the present disclosure.

FIG. 8A is a cross-sectional schematic diagram of a portion of a microelectronic assembly 900 in accordance with embodiments described herein. As shown in FIG. 8A, assembly 900 includes a first die 902 stacked on a second die 904. In the illustrated embodiment, first die 902 includes a hot TSV 905 connected at one end to a front side interconnect 906, which in the illustrated embodiment is disposed on a back-end insulator layer 907 on the front side of the first die 902. In the illustrated embodiment, the front side interconnect 906 is further connected to back-end metals 908 (e.g., within the back-end insulator layer 907). An opposite end of the hot TSV 905 is coaxial with and electrically connected to a copper pillar 912.

The second die 904 includes back-end metals 914 (e.g., within a back-end insulator layer 915). A copper pillar 916 is electrically connected to the back-end metals 914. Copper pillars 912 and 916 are joined via a solder joint 918 to form a DTD connection 920 between the first die 902 and the second die 904.

Figure 8B:
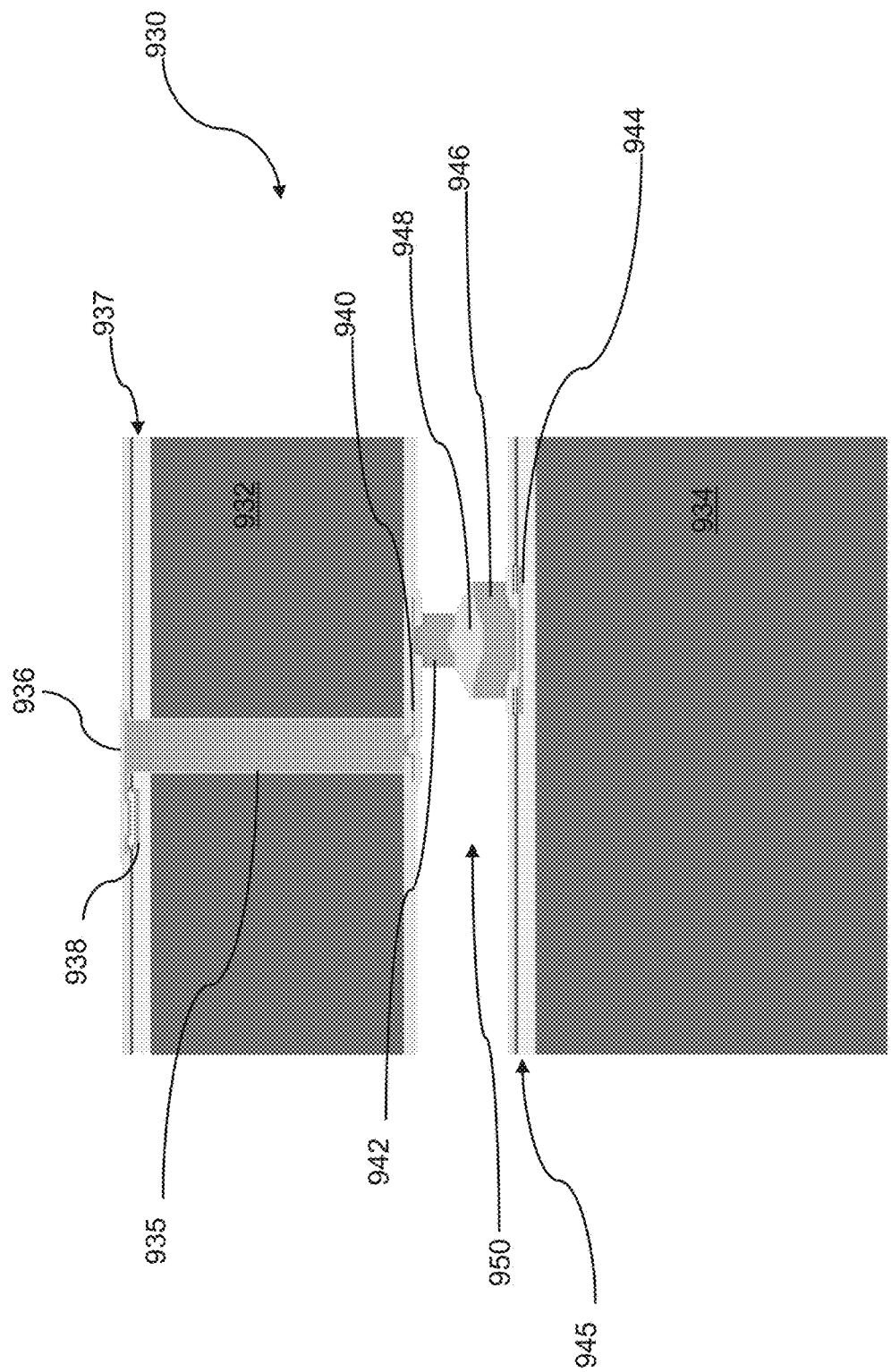
FIG. 8B is a schematic view of an interconnection between a top die and a bottom die of a microelectronic assembly according to other embodiments of the present disclosure.

FIG. 8B is a cross-sectional schematic diagram of a portion of a microelectronic assembly 930 in accordance with embodiments described herein. As shown in FIG. 8B, assembly 930 includes a first die 932 stacked on a second die 934. In the illustrated embodiment, first die 932 includes a hot TSV 935 connected at one end to a front side interconnect 936, which in the illustrated embodiment is disposed on a back-end insulator layer 937 on the front side of the first die 932. In the illustrated embodiment, the front side interconnect 936 is further connected to back-end metals 938 (e.g., within the back-end insulator layer 937). An opposite end of the hot TSV 935 is connected to a back side interconnect 940 disposed on a back side of the first die 932 (e.g., within an RDL on the back side of the die 930) to route the signal from the hot TSV 935 to a copper pillar 942.

The second die 934 includes back-end metals 944 (e.g., within a back-end insulator layer 945). A copper pillar 946 is electrically connected to the back-end metals 944. Copper pillars 942 and 946 are joined via a solder joint 948 to form a DTD connection 950 between the first die 932 and the second die 934.

Figure 8C:
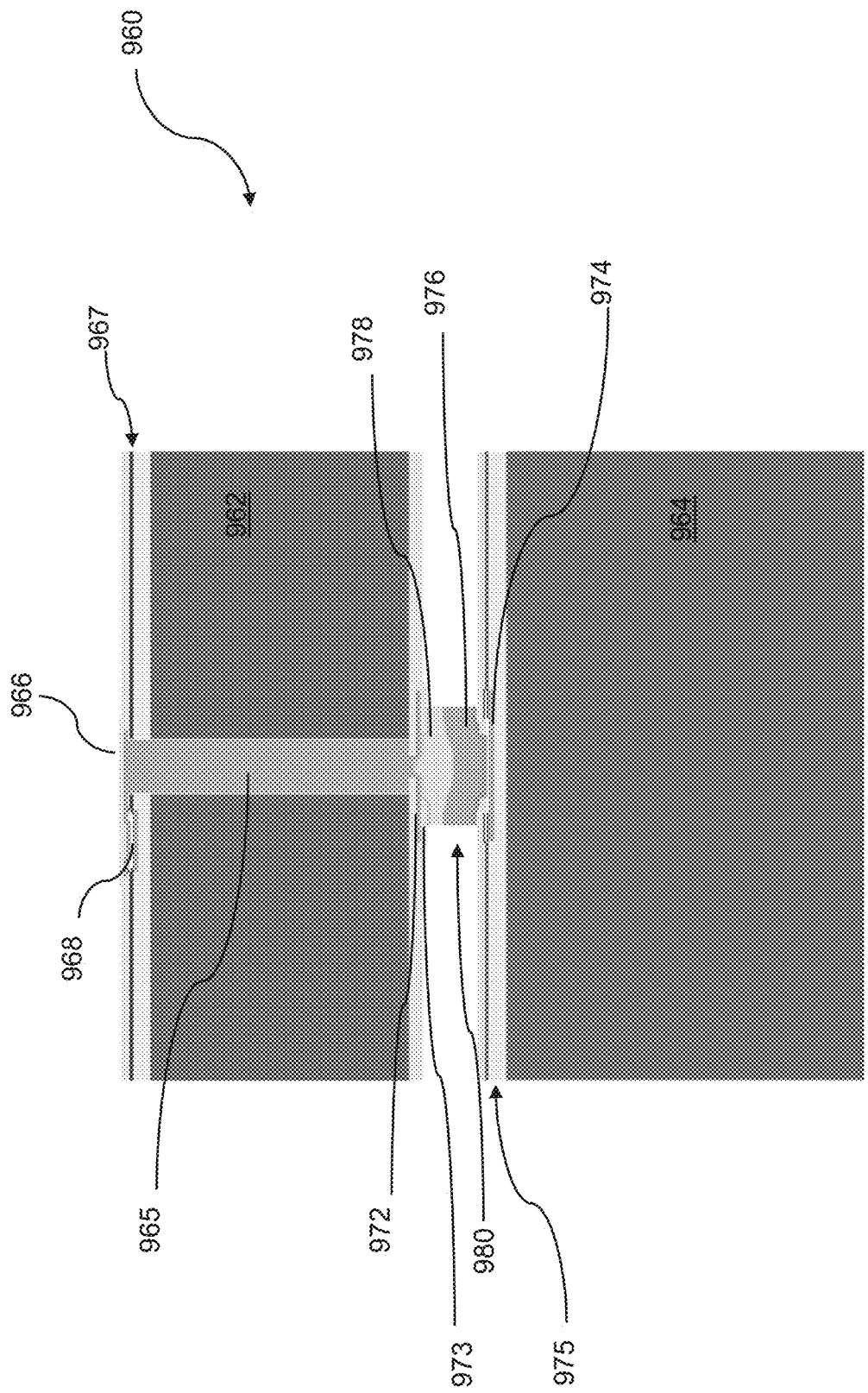
FIG. 8C is a schematic view of an interconnection between a top die and a bottom die of a microelectronic assembly according to still other embodiments of the present disclosure.

FIG. 8C is a cross-sectional schematic diagram of a portion of a microelectronic assembly 960 in accordance with embodiments described herein. As shown in FIG. 8C, assembly 960 includes a first die 962 stacked on a second die 964. In the illustrated embodiment, first die 962 includes a hot TSV 965 connected at one end to a front side interconnect 966, which in the illustrated embodiment is disposed on a back-end insulator layer 967 on the front side of the first die 962. In the illustrated embodiment, the front side interconnect 966 is further connected to back-end metals 968 (e.g., within the back-end insulator layer 967). An opposite end of the hot TSV 965 is coaxial with and electrically connected to metal pad 973 by way of a back side interconnect 972.

The second die 964 includes back-end metals 974 (e.g., within a back-end insulator layer 975). A copper pillar 976 is electrically connected to the back-end metals 974. Metal pad 973 and copper pillar 976 are joined via a solder joint 978 to form a DTD connection 980 between the first die 962 and the second die 964.

It will be recognized that in the embodiments illustrated in FIGS. 8A-8C the solder joints may be replaced by hybrid bonding without departing from the spirit or scope of the disclosure. Additionally and/or alternatively, any of the copper pillars may be replaced by copper bumps or pads without departing from the spirit or scope of the disclosure.

Figure 9A:
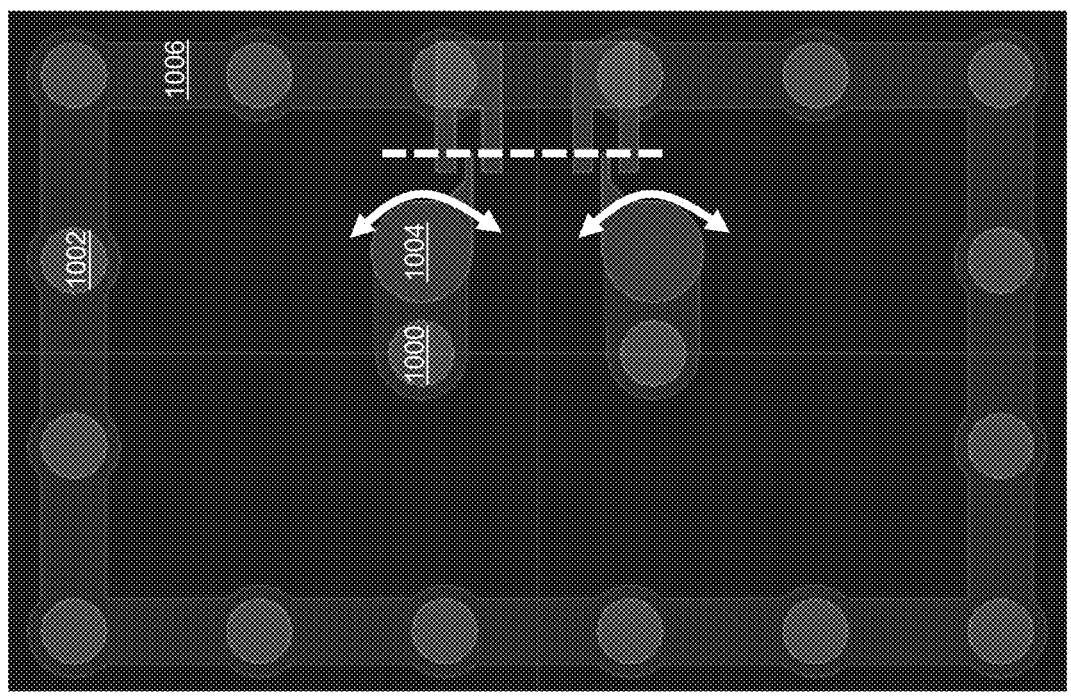
FIGS. 9A-9C collectively illustrate a transition layout for implementing a pair of hot TSVs of a microelectronic assembly according to some embodiments of the present disclosure.
Figure 9B:
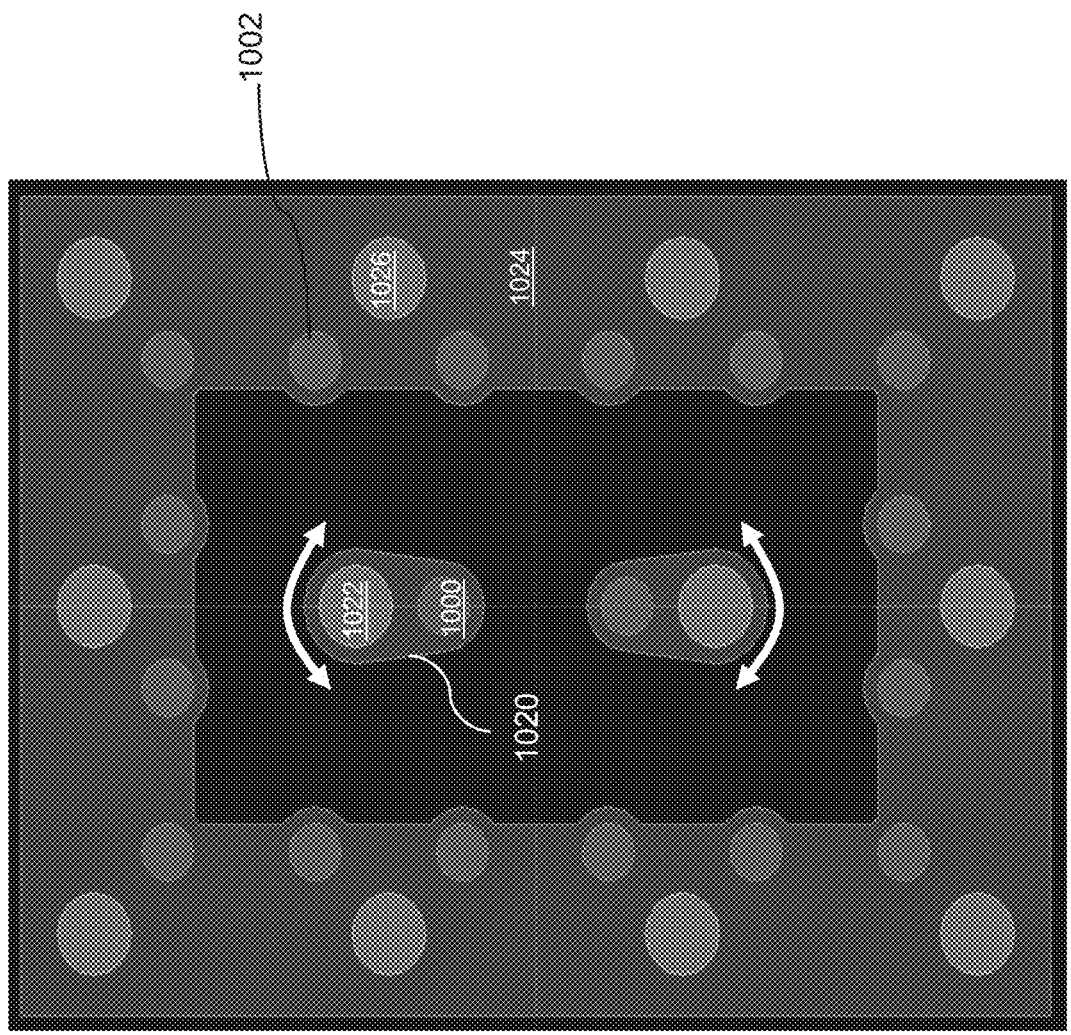
Figure 9C:
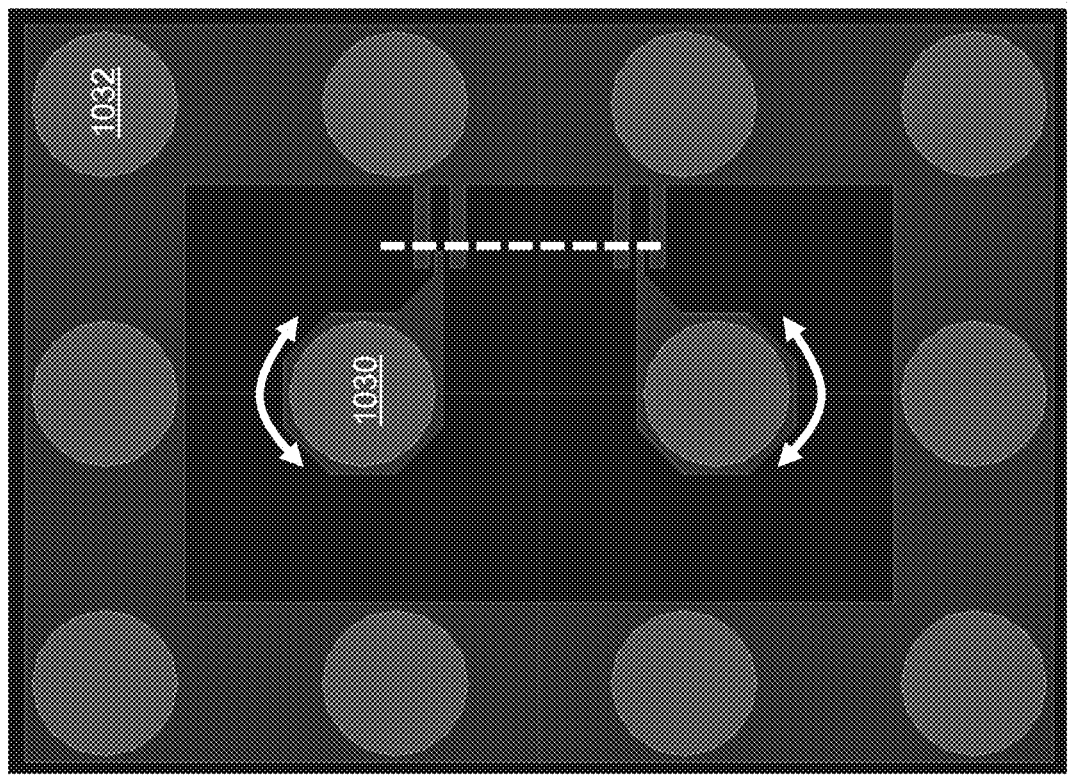

FIGS. 9A-9C collectively illustrate a transition layout for implementing a twin RF transmission line for a microelectronic assembly according to some embodiments of the present disclosure. FIG. 9A is a schematic representation of a front side of a top die comprising a twin RF transmission line arrangement. As shown in FIG. 9A, the front side of the top die includes a pair of hot TSVs 1000 surrounded by ground vias 1002. Each hot TSV 1000 is electrically connected to a front side interconnect 1004 (which may be a post passivation interconnect (PPI)) for inputting RF signals to the hot TSVs 1000. A ground plane 1006 is provided and is electrically connected to the ground vias 1002. As previously noted, ground vias 1002 operate to shield signals transmitted via the hot TSVs 1000.

FIG. 9B is a schematic representation of a back side of the top die shown in FIG. 9B. As shown in FIG. 9B, the back side of the top die includes a back side PPI 1020 connecting copper pillars 1022 with the hot TSVs 1000. A ground plane 1024 provides an electrical connection between ground vias 1002 and copper pillars 1026.

FIG. 9C is a schematic representation of a front side of a bottom die for interconnecting with the top die shown in FIGS. 9A and 9B. As shown in FIG. 9C, the front side of the bottom die includes copper pillars 1030 for forming signal DTD interconnects with copper pillars 1022 (FIG. 9B). Similarly, the front side of the bottom die includes copper pillars 1032 for forming ground DTD interconnects with copper pillars 1026 (FIG. 9B).

Figure 10A:
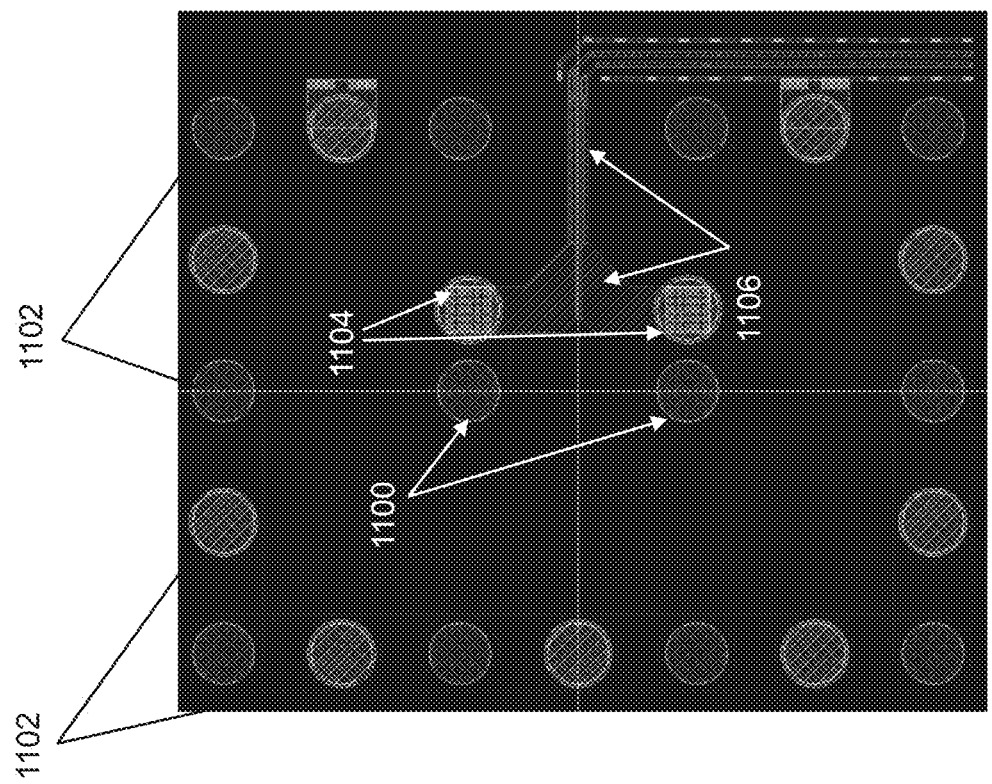
FIGS. 10A-10B collectively illustrate a transition from a pair of hot TSVs to horizontal transmission lines of a microelectronic assembly according to some embodiments of the present disclosure.
Figure 10B:
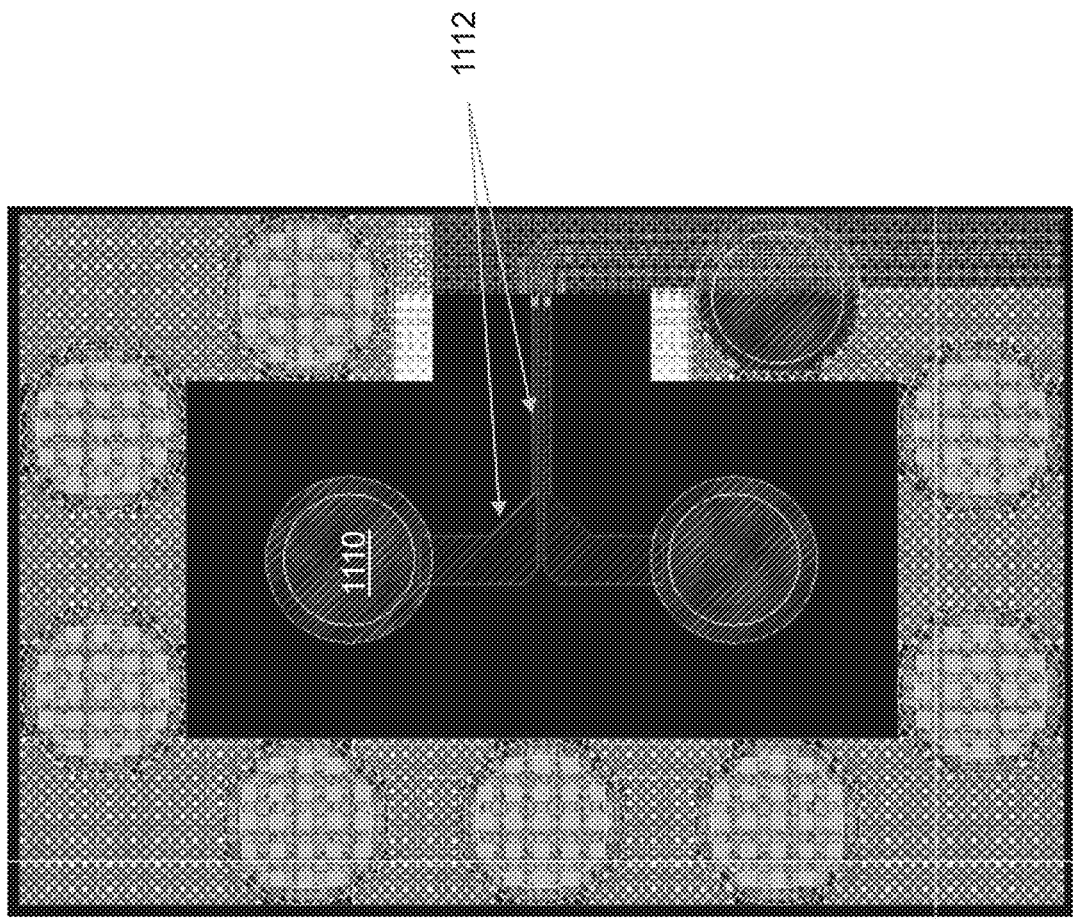

FIGS. 10A-10B collectively illustrate a transition from a pair of hot TSVs to horizontal transmission lines of a microelectronic assembly according to some embodiments of the present disclosure. FIG. 10A is a schematic representation of a front side of a top die comprising a twin RF transmission line arrangement. As shown in FIG. 10A, the front side of the top die includes a pair of hot TSVs 1100 surrounded by ground vias 1102. Each hot TSV 1000 is electrically connected to a horizontal transmission line on a front surface of the die via a front side interconnect 1104 and a metal transition structure 1106. FIG. 10B is a schematic representation of a front side of a bottom die comprising a twin RF transmission line arrangement. As shown in FIG. 10B, the front side of the bottom die includes a pair of copper pillars, or bumps, 1110, corresponding to pillars electrically connected to the hot TSVs 1100 provided on a back surface of the top die (FIG. 10A). Each pillar 1110 is electrically connected to a horizontal transmission line on a front surface of the die via a metal transition structure 1112.

Figure 11:
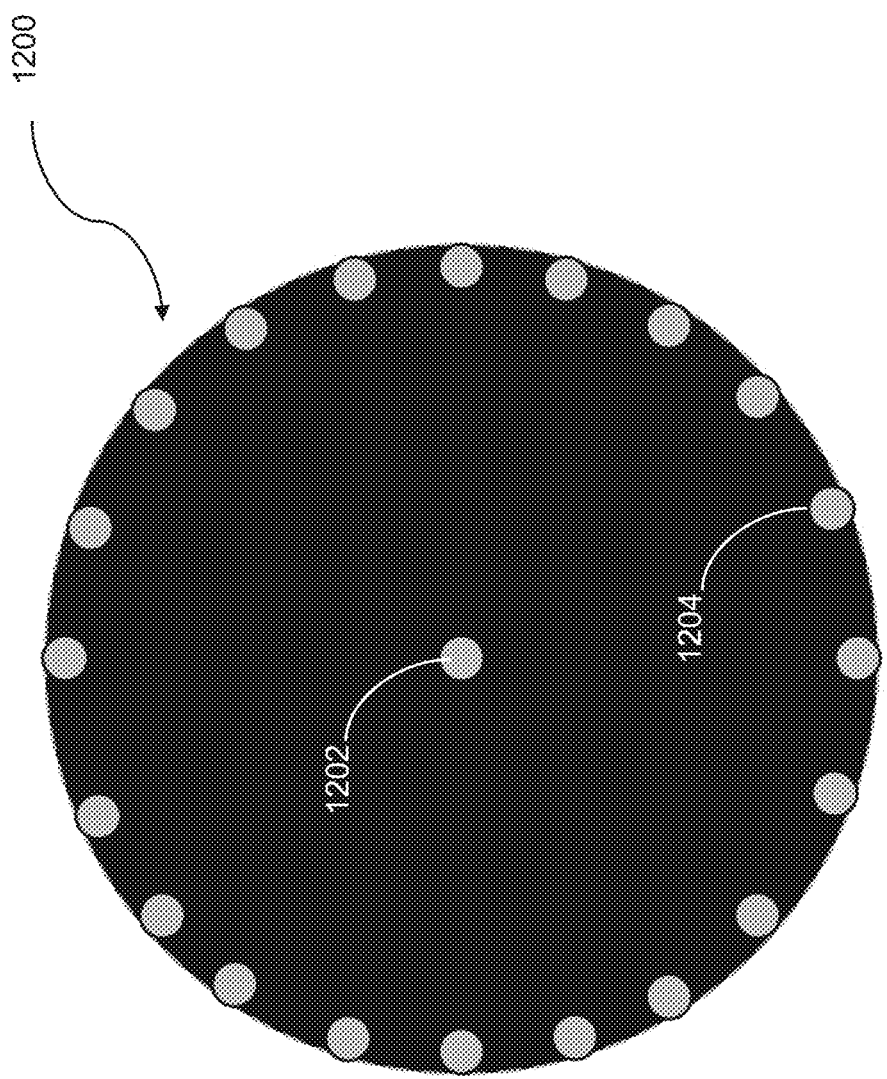
FIG. 11 is a schematic view of a coax RF signal transmission line arrangement for a microelectronic assembly according to some embodiments of the present disclosure.

FIG. 11 is a schematic view of a coax RF signal transmission line arrangement 1200 for a microelectronic assembly according to some embodiments of the present disclosure. As shown in FIG. 11, the arrangement 1200 includes a single hot TSV 1202, which may be implemented in a similar fashion as hot TSVs 202 (FIG. 2), surrounded by ground vias 1204, which may be implemented in a similar manner as ground vias 204 (FIG. 2). Although ground vias 1204 are shown as being arranged in a circular shape around the hot TSV 1202, it will be recognized that ground vias 204 may be arranged around the hot TSV 1202 in other configurations without departing from the spirit or scope of embodiments described herein.

Figure 12:
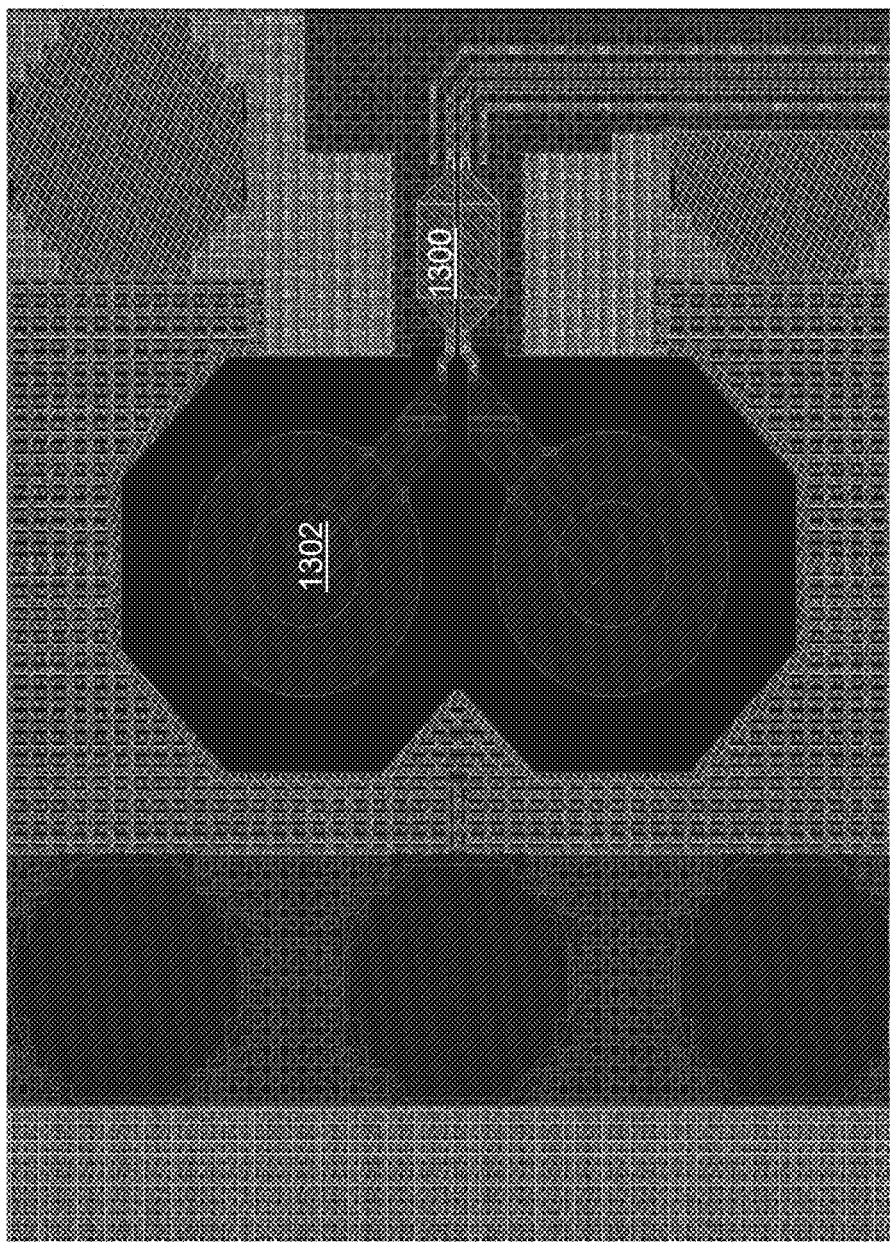
FIG. 12 is a schematic view of a front side of a bottom die of a microelectronic assembly including metal-on-metal (MOM) capacitors according to some embodiments of the present disclosure.

FIG. 12 is a schematic view of a front side of a bottom die of a microelectronic assembly including metal-on-metal (MOM) capacitors 1300 which may be arranged with respect to bottom die signal bumps 1302 (similar to bottom die signal bumps 1100 (FIG. 10B)) as shown in FIG. 12.

Figure 13:
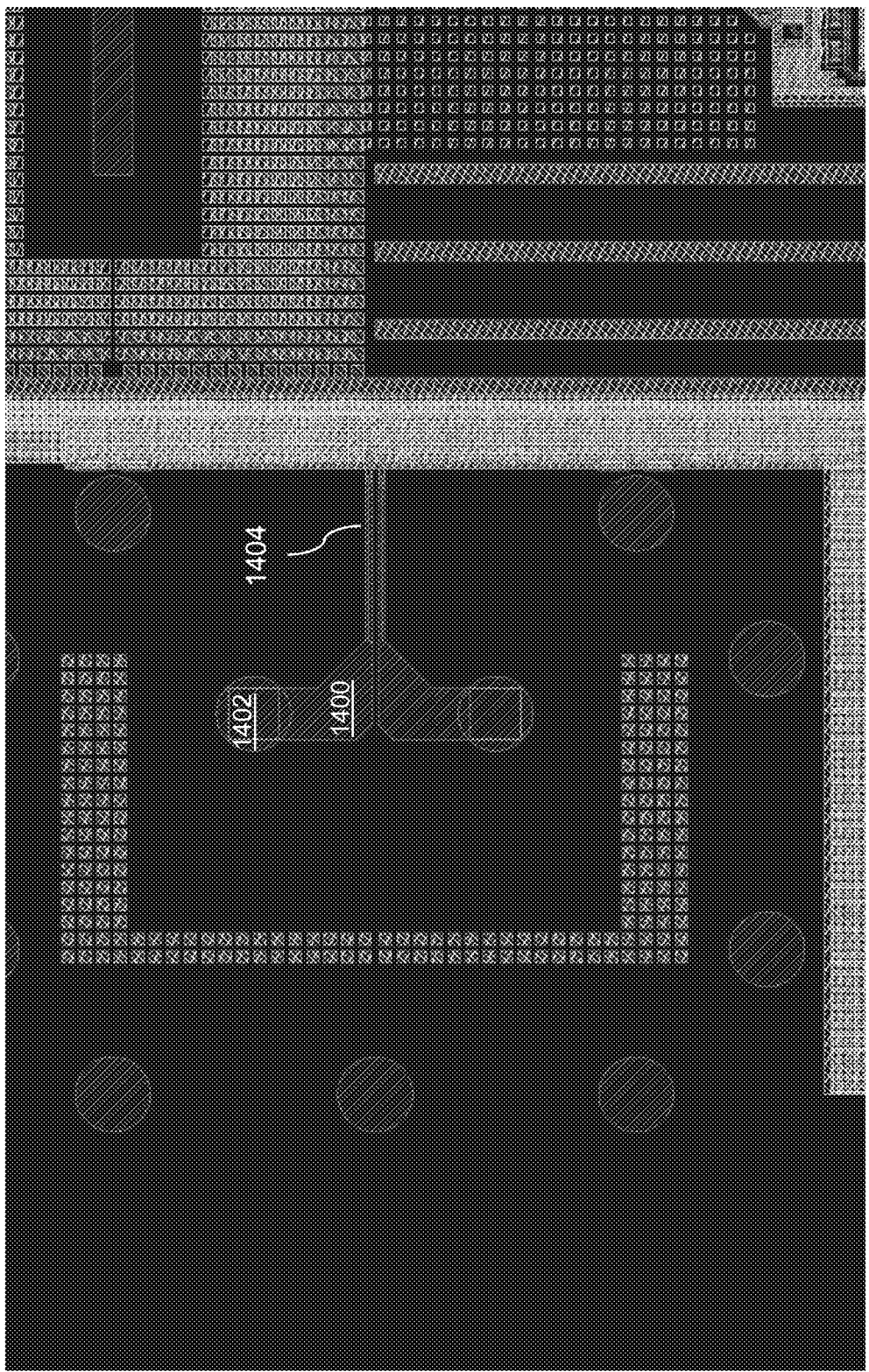
FIG. 13 is a schematic view of a front side of a top die of a microelectronic assembly including a TSV-to-waveguide transition according to some embodiments of the present disclosure.

FIG. 13 is a schematic view of a front side of a top die of a microelectronic assembly including a transition 1400 between a hot TSV 1402 and a coplanar waveguide 1404 according to some embodiments of the present disclosure.

Select Examples

Example 1 provides a microelectronic assembly comprising an assembly support structure; a first die including a first side and a second side, the first die further including at least one hot via comprising a through-substrate-via (TSV) extending through the first die between the first and second sides of the first die; a plurality of ground vias extending through the first die between the first and second sides of the first die, wherein the plurality of ground vias are disposed around the at least one hot via; and at least one signal interconnect structure electrically connected to the at least one hot via, the at least one signal interconnect structure disposed on the second side of the first die; and a second die between the assembly support structure and the first die, the second die including a first side and a second side, the second die further including at least one signal interconnect structure disposed on the first side of the second die; wherein the first die is connected to the second die via a signal die-to-die (DTD) interconnect structure comprising the at least one signal interconnect structure of the first die and the at least one signal interconnect structure of the second die.

Example 2 provides the microelectronic assembly of example 1 further comprising a microelectronic assembly of claim 1, wherein the signal DTD interconnect structure comprises at least one of a solder joint and a hybrid bond between the at least one signal interconnect structure of the first die and the at least one signal interconnect structure of the second die.

Example 3 provides the microelectronic assembly of any of the foregoing examples, wherein the at least one signal interconnect structure of the first die and the at least one signal interconnect structure of the second die each comprise a structure including copper.

Example 4 provides the microelectronic assembly of example 3, wherein a diameter of the at least one signal interconnect structure of the first die is less than or substantially equal to a diameter of the at least one interconnect signal structure of the second die.

Example 5 provides the microelectronic assembly of any of the foregoing examples, wherein the first die further comprises a first ground plane on the first side of the first die and a second ground plane on the second side of the first die and wherein the plurality of ground vias extend from the first ground plane to the second ground plane.

Example 6 provides the microelectronic assembly of example 5, further comprising at least one ground interconnect structure electrically connected to the second ground plane, wherein the first die is connected to the second die via a ground DTD interconnect comprising the at least one ground interconnect structure and at least one ground interconnect structure disposed on the first side of the second die.

Example 7 provides the microelectronic assembly of example 6, wherein the at least one ground DTD interconnect comprises at least one of a solder joint and a hybrid bond between the at least one ground interconnect structure of the first die and the at least one ground interconnect structure of the second die.

Example 8 provides the microelectronic assembly of example 6, wherein the at least one ground interconnect structure of the first die and the at least one ground interconnect structure of the second die each comprise a structure including copper.

Example 9 provides the microelectronic assembly of example 8, wherein a diameter of the at least one ground interconnect structure of the first die is less than or substantially equal to a diameter of the at least one ground interconnect structure of the second die.

Example 10 provides the microelectronic assembly of any of the foregoing examples, wherein the at least one signal interconnect structure of the first die and the at least one signal interconnect structure of the second die comprises copper.

Example 11 provides the microelectronic assembly of any of the foregoing examples, wherein the at least one hot TSV comprises a pair of hot TSVs.

Example 12 provides the microelectronic assembly of example 11, wherein the at least one ground via comprises a plurality of ground vias arranged in a rectangular shape around the pair of hot TSVs.

Example 13 provides the microelectronic assembly of any of the foregoing examples, wherein the at least one ground via comprises a plurality of ground vias arranged in a circular shape around the at least one TSV.

Example 14 provides an integrated circuit (IC) die comprising a hot through-substrate-via (TSVs) extending through the IC die between first and second opposing sides thereof; a plurality of ground vias extending through the IC die between the first and second sides of the IC die, wherein the plurality of ground vias surround the TSV and are arranged in a circular shape; a first die-to-die (DTD) interconnect element electrically connected to hot TSV and disposed on the second side of the IC die, the first DTD interconnect element for connection to a corresponding second DTD interconnect element of a second IC die to form a signal die-to-die (DTD) interconnect between the first die and the second die; and a plurality of third die-to-die (DTD) interconnect elements electrically connected to the ground vias and disposed on the second side of the IC die, the third DTD interconnect elements for connection to corresponding fourth DTD interconnect elements of the second IC die to form ground die-to-die (DTD) interconnects between the first die and the second die.

Example 15 provides an integrated circuit (IC) die comprising a pair of hot through-substrate-via (TSVs) extending through the IC die between first and second opposing sides thereof; a plurality of ground vias extending through the IC die between the first and second sides of the IC die, wherein the plurality of ground vias surround the pair of hot TSVs; and a pair of first die-to-die (DTD) interconnect elements electrically connected to the pair of hot TSVs and disposed on the second side of the IC die, the pair of first DTD interconnect elements for connection to corresponding second DTD interconnect elements of a second IC die to form signal die-to-die (DTD) interconnects between the first die and the second die.

Example 16 provides the IC die of example 15, further comprising a radiating element on the first side of the IC die.

Example 17 provides the IC die of example 16, further comprising a cavity on the second side of the IC die substantially opposite the radiating element.

Example 18 provides the IC die of any of the foregoing examples, wherein the plurality of ground vias are arranged in a rectangular shape around the pair of hot TSVs.

Example 19 provides the IC die of any of the foregoing examples, wherein the pair of first DTD interconnect elements comprise at least one of a conductive pillar, a conductive bump, and a conductive pad.

Example 20 provides the IC die of any of the foregoing examples, wherein the pair of first DTD interconnect elements are connected to the second DTD interconnect elements using at least one of a solder bond and a hybrid bond.

It should be noted that all of the specifications, dimensions, and relationships outlined herein (e.g., the number of elements, operations, steps, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, exemplary embodiments have been described with reference to particular component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system may be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and may accommodate a large number of components, as well as more complicated/sophisticated arrangements and configurations. Accordingly, the examples provided should not limit the scope or inhibit the broad teachings of the electrical circuits as potentially applied to myriad other architectures.

It should also be noted that in this Specification, references to various features (e.g., elements, structures, modules, components, steps, operations, characteristics, etc.) included in "one embodiment", "exemplary embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It should also be noted that the functions related to circuit architectures illustrate only some of the possible circuit architecture functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Note that all optional features of the device and system described above may also be implemented with respect to the method or process described herein and specifics in the examples may be used anywhere in one or more embodiments.

The "means for" in these instances (above) may include (but is not limited to) using any suitable component discussed herein, along with any suitable software, circuitry, hub, computer code, logic, algorithms, hardware, controller, interface, link, bus, communication pathway, etc.

Note that with the example provided above, as well as numerous other examples provided herein, interaction may be described in terms of two, three, or four network elements. However, this has been done for purposes of clarity and example only. In certain cases, it may be easier to describe one or more of the functionalities of a given set of flows by only referencing a limited number of network elements. It should be appreciated that topologies illustrated in and described with reference to the accompanying FIGURES (and their teachings) are readily scalable and may accommodate a large number of components, as well as more complicated/sophisticated arrangements and configurations. Accordingly, the examples provided should not limit the scope or inhibit the broad teachings of the illustrated topologies as potentially applied to myriad other architectures.

It is also important to note that the steps in the preceding flow diagrams illustrate only some of the possible signaling scenarios and patterns that may be executed by, or within, communication systems shown in the FIGURES. Some of these steps may be deleted or removed where appropriate, or these steps may be modified or changed considerably without departing from the scope of the present disclosure. In addition, a number of these operations have been described as being executed concurrently with, or in parallel to, one or more additional operations. However, the timing of these operations may be altered considerably. The preceding operational flows have been offered for purposes of example and discussion. Substantial flexibility is provided by communication systems shown in the FIGURES in that any suitable arrangements, chronologies, configurations, and timing mechanisms may be provided without departing from the teachings of the present disclosure.

Although the present disclosure has been described in detail with reference to particular arrangements and configurations, these example configurations and arrangements may be changed significantly without departing from the scope of the present disclosure. For example, although the present disclosure has been described with reference to particular communication exchanges, embodiments described herein may be applicable to other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 142 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. A microelectronic assembly comprising:
   an assembly support structure;
   a first die including a first side and a second side, the first die further including:
   a pair of hot through-substrate-vias (TSVs) extending through the first die between the first and second sides of the first die, the pair of hot TSVs arranged as twin radio frequency signal transmission lines in a differential configuration;
   a plurality of ground vias extending through the first die between the first and second sides of the first die, wherein the plurality of ground vias are disposed around the pair of hot TSVs; and
   at least one signal interconnect structure electrically connected to at least one hot TSV of the pair of hot TSVs, the at least one signal interconnect structure disposed on the second side of the first die; and
   a second die between the assembly support structure and the first die, the second die including a first side and a second side, the second die further including at least one signal interconnect structure disposed on the first side of the second die;
   wherein the first die is connected to the second die via a signal die-to-die (DTD) interconnect structure comprising the at least one signal interconnect structure of the first die and the at least one signal interconnect structure of the second die.

2. The microelectronic assembly of claim 1, wherein the signal DTD interconnect structure comprises at least one of a solder joint and a hybrid bond between the at least one signal interconnect structure of the first die and the at least one signal interconnect structure of the second die.

3. The microelectronic assembly of claim 1, wherein the at least one signal interconnect structure of the first die and the at least one signal interconnect structure of the second die each comprise a structure including copper.

4. The microelectronic assembly of claim 3, wherein a diameter of the at least one signal interconnect structure of the first die is less than or substantially equal to a diameter of the at least one signal interconnect structure of the second die.

5. The microelectronic assembly of claim 1, wherein the first die further comprises a first ground plane on the first side of the first die and a second ground plane on the second side of the first die and wherein the plurality of ground vias extend from the first ground plane to the second ground plane.

6. The microelectronic assembly of claim 5, further comprising at least one ground interconnect structure electrically connected to the second ground plane, wherein the first die is connected to the second die via a ground DTD interconnect comprising the at least one ground interconnect structure and at least one ground interconnect structure disposed on the first side of the second die.

7. The microelectronic assembly of claim 6, wherein the ground DTD interconnect comprises at least one of a solder joint and a hybrid bond between the at least one ground interconnect structure of the first die and the at least one ground interconnect structure of the second die.

8. The microelectronic assembly of claim 6, wherein the at least one ground interconnect structure of the first die and the at least one ground interconnect structure of the second die each comprise a structure including copper.

9. The microelectronic assembly of claim 8, wherein a diameter of the at least one ground interconnect structure of the first die is less than or substantially equal to a diameter of the at least one ground interconnect structure of the second die.

10. The microelectronic assembly of claim 1, wherein the first die comprises a radiating element on the first side.

11. An integrated circuit (IC) die comprising:
    a pair of hot through-substrate-via (TSVs) extending through the IC die between first and second opposing sides thereof;
    a plurality of ground vias extending through the IC die between the first and second sides of the IC die, wherein the plurality of ground vias surround the pair of hot TSVs;
    a pair of first die-to-die (DTD) interconnect elements electrically connected to the pair of hot TSVs and disposed on the second side of the IC die, the pair of first DTD interconnect elements for connection to corresponding second DTD interconnect elements of a second IC die to form signal die-to-die (DTD) interconnects between the IC die and the second die; and
    a radiating element on the first side of the IC die.

12. The IC die of claim 11, further comprising a cavity on the second side of the IC die substantially opposite the radiating element.

13. The IC die of claim 11, wherein the plurality of ground vias are arranged in a rectangular shape around the pair of hot TSVs.

14. The IC die of claim 11, wherein the pair of first DTD interconnect elements comprise at least one of a conductive pillar, a conductive bump, and a conductive pad.

15. The IC die of claim 11, wherein the pair of first DTD interconnect elements are connected to the second DTD interconnect elements using at least one of a solder bond and a hybrid bond.

16. The IC die of claim 11, wherein the pair of hot TSVs are arranged as twin transmission lines.

17. A die comprising:
a substrate comprising a first side and a second side; and
a pair of hot through-substrate-vias (TSVs) extending through the substrate between the first side and the second side, the pair of hot TSVs arranged and dimensioned to provide a controlled impedance differential transmission line.

18. The die of claim 17, further comprising a radiating element on the first side of the substrate.

19. The die of claim 17, further comprising a plurality of ground vias extending through the substrate between the first side and the second side, the plurality of ground vias positioned around the pair of hot TSVs for shielding.

20. A microelectronic assembly comprising:
an assembly support substrate;
the die of claim 17, the die further comprising a first signal interconnect structure electrically connected to at least one hot TSV of the pair of hot TSVs; and
a second die positioned between the assembly support structure and the die, the second die comprising a second signal interconnect structure disposed on a side of the second die that is facing the die;
wherein the die is connected to the second die via a signal die-to-die (DTD) interconnect structure comprising the first one signal interconnect structure and the second signal interconnect structure.

* * * * *